(12) United States Patent
Liu et al.

(10) Patent No.: US 9,818,677 B2
(45) Date of Patent: Nov. 14, 2017

(54) SEMICONDUCTOR COMPONENT HAVING GROUP III NITRIDE SEMICONDUCTOR DEVICE MOUNTED ON SUBSTRATE AND INTERCONNECTED TO LEAD FRAME

(71) Applicant: SEMICONDUCTOR COMPONENTS INDUSTRIES, LLC, Phoenix, AZ (US)

(72) Inventors: Chun-Li Liu, Scottsdale, AZ (US); Ali Salih, Mesa, AZ (US); Balaji Padmanabhan, Tempe, AZ (US); Mingjiao Liu, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/202,765

(22) Filed: Jul. 6, 2016

(65) Prior Publication Data
US 2017/0025335 A1 Jan. 26, 2017

Related U.S. Application Data

(60) Provisional application No. 62/196,626, filed on Jul. 24, 2015.

(51) Int. Cl.
*H01L 23/495* (2006.01)
*H01L 23/00* (2006.01)
(Continued)

(52) U.S. Cl.
CPC .... *H01L 23/49575* (2013.01); *H01L 23/3735* (2013.01); *H01L 23/49524* (2013.01);
(Continued)

(58) Field of Classification Search
CPC ............... H01L 23/142; H01L 23/3735; H01L 23/49555; H01L 23/49562;
(Continued)

(56) References Cited

U.S. PATENT DOCUMENTS 8,455,987 B1  6/2013  Spann et al.
8,847,408 B2 * 9/2014  Lin ................... H01L 23/49562
                                                              257/777
(Continued)

*Primary Examiner* — Stephen W Smoot
(74) *Attorney, Agent, or Firm* — Rennie William Dover

(57) ABSTRACT

In accordance with an embodiment, a semiconductor component is provided that includes a leadframe having a device receiving area, one or more leadframe leads and at least one insulated metal substrate bonded to a first portion of the device receiving area. A first semiconductor device is mounted to a first insulated metal substrate, the first semiconductor device configured from a III-N semiconductor material. A first electrical interconnect is coupled between the first current carrying terminal of the first semiconductor device and a second portion of the die receiving area. In accordance with another embodiment, method includes providing a first semiconductor chip comprising a III-N semiconductor substrate material and a second semiconductor chip comprising a silicon based semiconductor substrate. The first semiconductor chip is mounted on a first substrate and the second semiconductor chip on a second substrate. The first semiconductor chip is electrically coupled to the second semiconductor chip.

17 Claims, 14 Drawing Sheets

(51) Int. Cl.
   *H01L 25/07* (2006.01)
   *H01L 23/373* (2006.01)
   *H01L 33/62* (2010.01)
   *H01L 29/20* (2006.01)

(52) U.S. Cl.
   CPC .. *H01L 23/49531* (2013.01); *H01L 23/49555* (2013.01); *H01L 23/49562* (2013.01); *H01L 23/49568* (2013.01); *H01L 24/73* (2013.01); *H01L 25/072* (2013.01); *H01L 33/62* (2013.01); *H01L 29/2003* (2013.01); *H01L 2224/40* (2013.01); *H01L 2224/40245* (2013.01); *H01L 2224/48091* (2013.01); *H01L 2224/48137* (2013.01); *H01L 2224/48245* (2013.01); *H01L 2224/49111* (2013.01); *H01L 2224/73221* (2013.01); *H01L 2224/73265* (2013.01)

(58) Field of Classification Search
   CPC ......... H01L 23/49568; H01L 23/49844; H01L 24/08; H01L 24/32; H01L 24/73; H01L 2224/08054; H01L 2224/08057; H01L 2224/32054; H01L 2224/32238; H01L 2224/40245; H01L 2224/48137; H01L 2224/49111; H01L 2224/73221; H01L 2224/73265; H01L 25/072; H01L 29/2003; H01L 29/267
   See application file for complete search history.

(56) References Cited

U.S. PATENT DOCUMENTS

| | | | |
|---|---|---|---|
| 9,496,207 B1* | 11/2016 | Le | H01L 23/49575 |
| 2007/0249092 A1 | 10/2007 | Joshi et al. | |
| 2008/0164590 A1 | 7/2008 | Xiaochun et al. | |
| 2010/0140627 A1* | 6/2010 | Shelton | H01L 23/49562 257/76 |
| 2010/0232131 A1 | 9/2010 | Qian et al. | |
| 2011/0133251 A1 | 6/2011 | He | |
| 2012/0223321 A1 | 9/2012 | Lin et al. | |
| 2013/0069208 A1 | 3/2013 | Briere | |
| 2013/0088280 A1 | 3/2013 | Lal et al. | |
| 2013/0175704 A1 | 7/2013 | Jeun | |
| 2013/0187627 A1* | 7/2013 | Imada | H01L 27/088 323/311 |
| 2013/0256856 A1 | 10/2013 | Mahler et al. | |
| 2014/0103510 A1 | 4/2014 | Andou | |
| 2014/0197525 A1 | 7/2014 | Kadoguchi | |
| 2014/0239472 A1 | 8/2014 | Jones et al. | |
| 2014/0361419 A1 | 12/2014 | Xue et al. | |
| 2014/0367701 A1* | 12/2014 | Fujino | H01L 24/83 257/77 |
| 2015/0145112 A1 | 5/2015 | Otremba | |
| 2016/0211246 A1 | 7/2016 | Akiyama et al. | |
| 2016/0247792 A1 | 8/2016 | Chang | |
| 2016/0293543 A1* | 10/2016 | Otremba | H01L 23/49562 |

* cited by examiner

SEMICONDUCTOR COMPONENT HAVING GROUP III NITRIDE SEMICONDUCTOR DEVICE MOUNTED ON SUBSTRATE AND INTERCONNECTED TO LEAD FRAME

The present application is a nonprovisional application of Provisional Patent Application No. 62/196,626 filed on Jul. 24, 2015, by Chun-Li Liu et al., titled "SEMICONDUCTOR COMPONENT AND METHOD OF MANUFACTURE", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, semiconductor manufacturers have used a combination of silicon semiconductor materials and III-N semiconductor materials to manufacture cascoded devices, such as a normally-on III-N depletion mode HEMT cascoded with a silicon device. Using this combination of materials helps achieve a normally-off state using a III-N depletion mode device that is normally-on. Cascoded semiconductor devices have been described in U.S. Patent Application Publication Number 2013/0088280 A1 by Rakesh K. Lal et al. and published on Apr. 11, 2013.

After manufacturing cascoded devices from different semiconductor substrate materials, semiconductor component manufacturers typically protect the silicon device and the depletion mode devices in separate packages and connect the devices in the separate packages together via leadframe leads to form a cascode device. A drawback with this approach is that increasing the number of packages increases the cost of a cascoded semiconductor component and degrades the performance of the cascoded devices because of increased parasitics such as parasitic capacitance and parasitic inductance.

Accordingly, it would be advantageous to have a cascoded semiconductor device and a method for manufacturing the cascoded semiconductor device. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
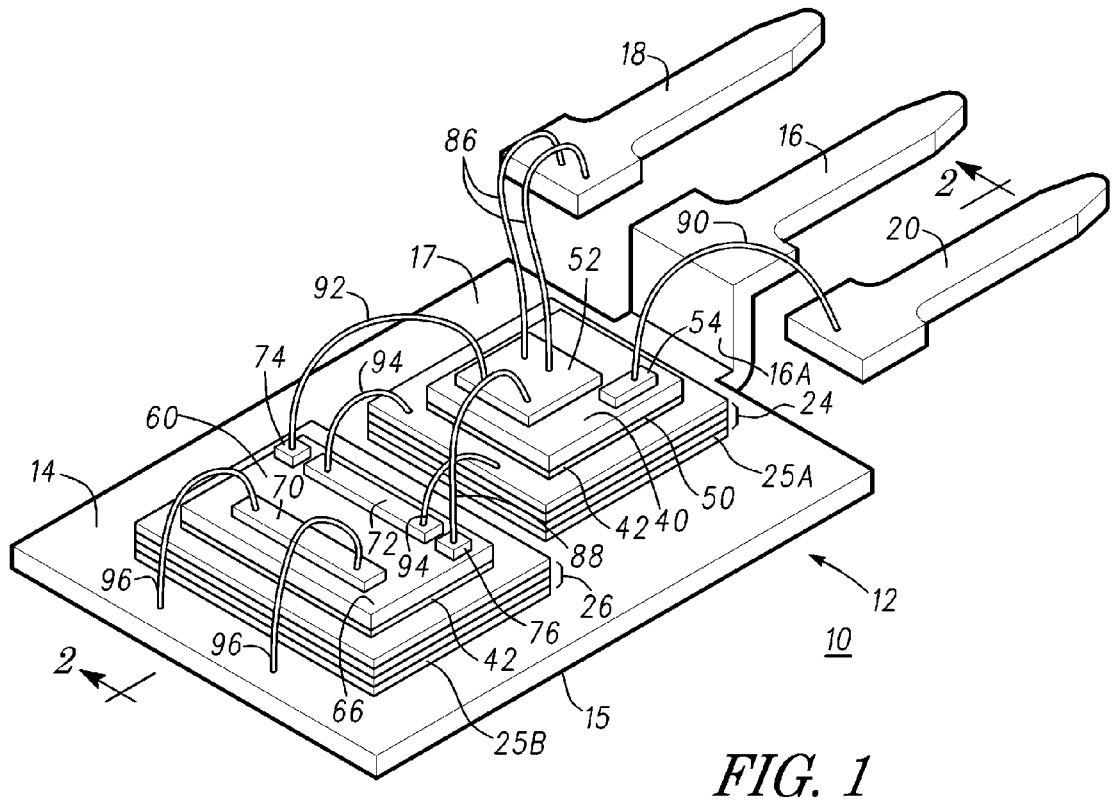
FIG. 1 is a perspective view of a semiconductor component in a cascode configuration in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

Generally, the present invention provides a semiconductor component and a method for manufacturing the semiconductor component wherein the semiconductor component includes a semiconductor chip comprising a III-N based semiconductor material coupled to a semiconductor chip comprising a silicon based semiconductor chip. More particularly, the semiconductor component comprises a leadframe having a device receiving area and at least a first leadframe lead and a second leadframe lead, the first leadframe lead serving as a first terminal of the semiconductor component and the second leadframe lead serving as a second terminal of the semiconductor component. At least one insulated metal substrate having a first surface and a second surface is bonded to a first portion of the die receiving area. A first semiconductor device is mounted to a first insulated metal substrate and has first and second current carrying terminals and is configured from a III-N semiconductor material. A first electrical interconnect is coupled between the first current carrying terminal of the first semiconductor device and a second portion of the die receiving area.

Figure 2:
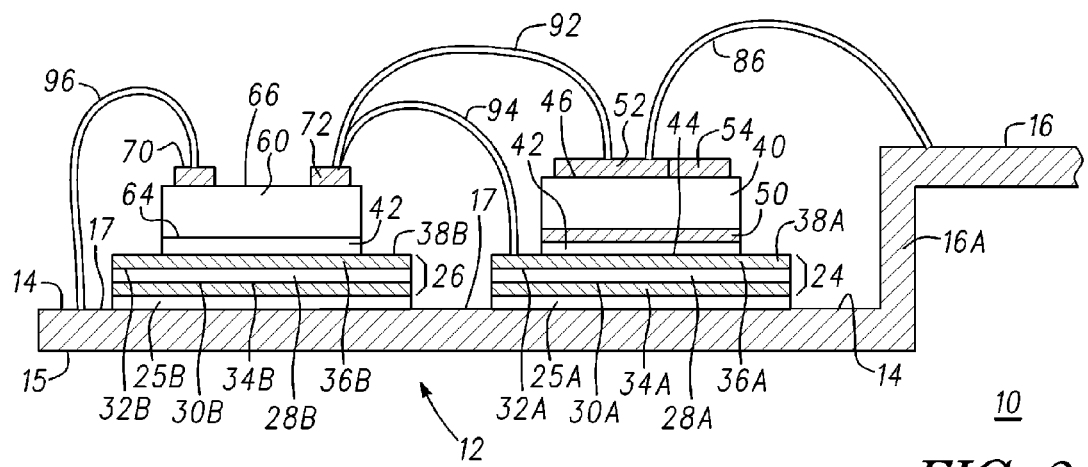
FIG. 2 is a cross-sectional view of the semiconductor component of FIG. 1 taken along section line 2-2 of FIG. 1.

FIG. 1 is a perspective view of a semiconductor component 10 in accordance with an embodiment of the present invention and FIG. 2 is a cross-sectional view of semiconductor component 10 taken along section line 2-2 of FIG. 1. It should be noted that FIGS. 1 and 2 are described together.

What is shown in FIGS. 1 and 2 are a leadframe 12 comprising a device receiving area 14 and leadframe leads 16, 18, and 20, wherein device receiving area 14 and leadframe lead 16 are integrally formed with each other, i.e., device receiving area 14 and leadframe lead 16 are derived from an electrically conductive material wherein a portion of the electrically conductive material serves as device receiving area 14 and another portion of the electrically conductive material serves as leadframe lead 16. Device receiving area 14 has opposing surfaces, 15 and 17. In accordance with an embodiment, the electrically conductive material is copper and the portion of the electrically conductive material that includes the device receiving area is formed in a plane and the portion of the electrically conductive material that includes leadframe lead 16 is formed in another plane that is different from the plane that includes the device receiving area. It should be noted that the electrically conductive material is not limited to being copper, but can be any electrically conductive material. Thus, device receiving area 14 and leadframe lead 16 are not co-planar. Leadframe lead 16 includes a connector portion 16A that connects leadframe lead 16 to device receiving area 14. Leadframe leads 18 and 20 are coplanar with leadframe lead 16. It should be noted that leadframe 12 is illustrated and described as a single element; however, it may be a portion singulated from a leadframe strip and that leadframe 12 conforms with through hole package outlines such as a TO-220 outline, a TO-247 outline, a TO-264 outline, a TO-257 outline, or the like.

A bonding substrate 24 is bonded to a portion of device receiving area 14 using an electrically conductive material 25A and a bonding substrate 26 is bonded to another portion of device receiving area 14 using an electrically conductive material 25B. Bonding substrates 24 and 26 may be referred to as a mounting structures. Electrically conductive material 25A and 25B may be solder, an electrically conductive epoxy, or the like. Although material 25A and 25B have been described as being an electrically conductive material, this is not a limitation of the present invention. Material 25A and 25B can be an electrically insulating material. Preferably, material 25A and 25B are thermally conductive materials. In accordance with an embodiment, mounting structures 24 and 26 are insulated metal substrates which may be, for example, a direct bonded copper substrates. Insulated metal substrate 24 may be comprised of an insulating material 28A having major surfaces 30A and 32A, wherein an electrically conductive layer 34A is formed on major surface 30A and an electrically conductive layer 36A is formed on major surface 32A and insulated metal substrate 26 may be comprised of an insulating material 28B having major surfaces 30B and 32B, wherein electrically conductive layer 34B is formed on major surface 30B and an electrically conductive layer 36B is formed on major surface 32B. Electrically conductive layer 36A has a surface 38A that serves as a surface of insulated metal substrate 24 and electrically conductive layer 36B has a surface 38B that serves as a surface of insulated metal substrate 26. In accordance with an embodiment, insulated metal substrates 24 and 26 are direct bonded copper substrates with insulating materials 28A and 28B are aluminum nitride and insulated electrically conductive layers 34A, 36A, 34B, and 36B are copper. Other suitable materials for insulating material 28A and 28B include alumina, beryllium oxide, or the like and other suitable materials for electrically conductive layers 34A, 36A, 34B, and 36B include aluminum, copper, or the like. Insulated metal substrates 24 and 26 are electrically bonded to separate portions of device receiving area 14 using an electrically conductive material such as, for example, solder. It should be noted that the material through which insulated metal substrates 24 and 26 are bonded to die receiving area 14 is not limited to being solder or to being the same material. For example, electrically conductive material 25A may be the same as electrically conductive material 25B or electrically conductive material 25A may be different from electrically conductive material 25B.

A semiconductor chip 40 is bonded to surface 38A of insulated metal substrate 24 using a die attach material 42. In accordance with an embodiment, semiconductor chip 40 is a silicon chip having opposing major surfaces 44 and 46, wherein semiconductor chip 40 includes a vertical field effect semiconductor device having a drain contact 50 formed on surface 44, a source contact 52 formed on a portion of surface 46, and a gate contact 54 formed on another portion of surface 46. In accordance with embodiments in which a discrete semiconductor device such as for example, a field effect transistor, is formed from semiconductor chip 40, semiconductor chip 40 may be referred to as a semiconductor device. Drain contact 50 is bonded to surface 38A of insulated metal substrate 24 through die attach material 42, wherein die attach material 42 is an electrically and thermally conductive die attach material. It should be noted that semiconductor device 40 is not limited to being a vertical field effect transistor or a field effect transistor. For example, semiconductor device 40 may be an insulated gate bipolar transistor, a bipolar transistor, a junction field effect transistor, a diode, or the like. It should be noted that a silicon chip comprises a semiconductor material that is silicon and thus may be referred to as a silicon based semiconductor material. In addition, the silicon based semiconductor material may be silicon doped with carbon, i.e., a carbon doped semiconductor material, or another suitable semiconductor material.

Still referring to FIGS. 1 and 2, a semiconductor chip 60 is bonded to surface 38B of insulated metal substrate 26 using die attach material 42. In accordance with an embodiment, semiconductor chip 60 is a compound semiconductor chip having opposing major surfaces 64 and 66, wherein semiconductor chip 60 includes a field effect semiconductor device 60 having a drain contact 70 formed on a portion of surface 66, a source contact 72 formed on another portion of surface 66, and gate contacts 74 and 76 formed on other portions of surface 66. In accordance with embodiments in which a discrete semiconductor device such as for example, a field effect transistor, is formed from semiconductor chip 60, semiconductor chip 60 may be referred to as a semiconductor device. Surface 64 is bonded to surface 38B of insulated metal substrate 26 through die attach material 42. It should be noted that semiconductor device 60 is not limited to being a field effect transistor. For example, semiconductor device 60 may be an insulated gate bipolar transistor, a bipolar transistor, a junction field effect transistor, a diode, or the like and fabricated from a suitable semiconductor material such as, for example, silicon, germanium, and wide bandgap materials including gallium nitride, gallium arsenide, or the like.

Although an insulated metal substrate is described as being bonded to device receiving area 14 by electrically conductive material 25A or an electrically conductive material 25B, this is not a limitation of the present invention. Alternatively, layers of electrically insulating material may be formed on portions of device receiving area 14 of leadframe 12. Then, a layer of electrically conductive material may be formed on each of the layers of insulating material on electrically insulating material on device receiving area 14. By way of example, the layers of electrically conductive material are copper. Techniques for forming an insulating material on an electrically conductive substrate such as a leadframe and for forming an electrically conductive material on an insulating material are known to those skilled in the art.

Source contact 52 of semiconductor device 40 is electrically connected to leadframe lead 18 through bond wires 86 and to gate contacts 74 and 76 of semiconductor device 60 through bond wires 92 and 88, respectively. Gate contact 54 of semiconductor device 40 is electrically connected to leadframe lead 20 through a bond wire 90. Gate contacts 74 and 76 of semiconductor device 60 are electrically connected to source contact 52 through bond wires 92 and 88, respectively, and to leadframe lead 18 through bond wires 86. Thus, gate contacts 74 and 76 are electrically connected to leadframe lead 18 through bond wires 92 and 88, source contact 52, and bond wires 86. Source contact 72 is connected to surface 38A of insulated metal substrate 24 through bond wires 94 and drain contact 70 is electrically connected to device receiving area 14 through bond wires 96. Gate contact 74 is electrically connected to gate contact 76 through a metallization system, not shown. Bond wires may be referred to as wirebonds. It should be noted that in accordance with this embodiment drain contact 50 of semiconductor device 40 is electrically connected to surface 38A of insulated metal substrate 24, whereas semiconductor device 60 is electrically connected to insulated metal substrate 26.

As those skilled in the art are aware, insulated metal substrates 24 and 26, semiconductor chips 40 and 60, and bond wires 86, 88, 90, 92, 94, and 96, and portions of leadframe 12 are encapsulated in a protection material such as, for example a mold compound. It should be noted that portions of surface 15 of device receiving area 14 may not be covered or protected by a mold compound.

Thus, semiconductor component 10 includes a III-N cascode switch in which the substrate of the III-N semiconductor material is electrically floating and bond pads are not formed over active regions of semiconductor device 60.

In accordance with embodiments, semiconductor device 40 is manufactured from a silicon based material and semiconductor device 60 is manufactured from a III-N semiconductor material. A silicon based material may include silicon, carbon doped silicon, silicon carbide material, silicon germanium material, silicon in combination with aluminum nitride, etc. A III-N semiconductor material includes gallium nitride, aluminum gallium nitride, etc. The silicon may be of p-type conductivity, n-type conductivity, or an intrinsic semiconductor material. Likewise, the III-N semiconductor material may be of p-type conductivity, n-type conductivity, or an intrinsic semiconductor material.

Figure 3:
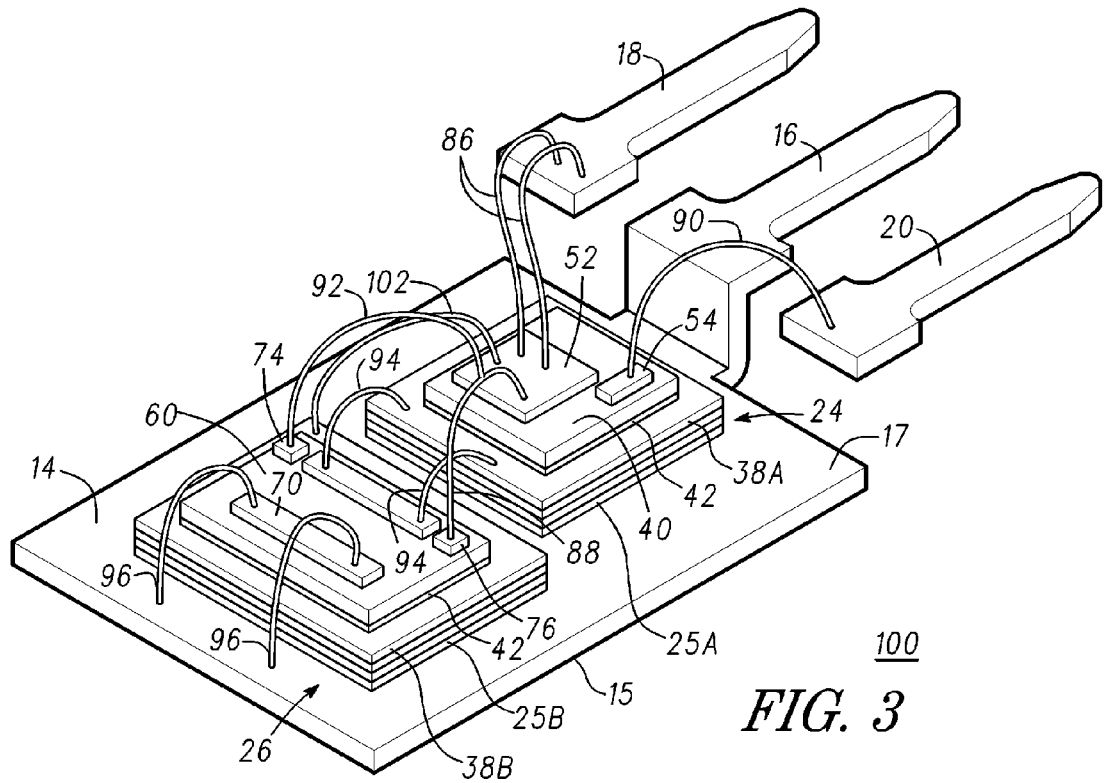
FIG. 3 is a perspective view of a semiconductor component in a cascode configuration in accordance with another embodiment of the present invention.

FIG. 3 is a perspective view of a semiconductor component 100 in accordance with another embodiment of the present invention. Semiconductor component 100 is similar to semiconductor component 10 except that semiconductor component 100 includes a bond wire 102 that connects source electrode 52 with surface 38B of insulated metal substrate 26. Mounting semiconductor chips 40 and 60 to insulated metal substrates 24 and 26, respectively, and mounting insulated metal substrates 24 and 26 to device receiving area 14 have been described with reference to FIGS. 1 and 2. Bond wire 102 electrically connects source electrode 52, i.e., the source, of semiconductor device 40 to the body of semiconductor material of semiconductor device 60. In a cascode connected system, the semiconductor material of semiconductor device 60, i.e., the body of semiconductor device 60, may be connected source electrode 52 through bond wire 102. In accordance with an embodiment, source electrode 52 is connected to ground through leadframe lead 18; thus the body of semiconductor device 60 may also be connected to ground or grounded though the connection to source electrode 52 and bond wire 102. Accordingly, semiconductor component 100 includes a III-N cascode switch in which the substrate of the III-N semiconductor material is electrically connected to insulated metal substrate 26 and bond pads are not formed over active regions of semiconductor device 60.

Figure 4:
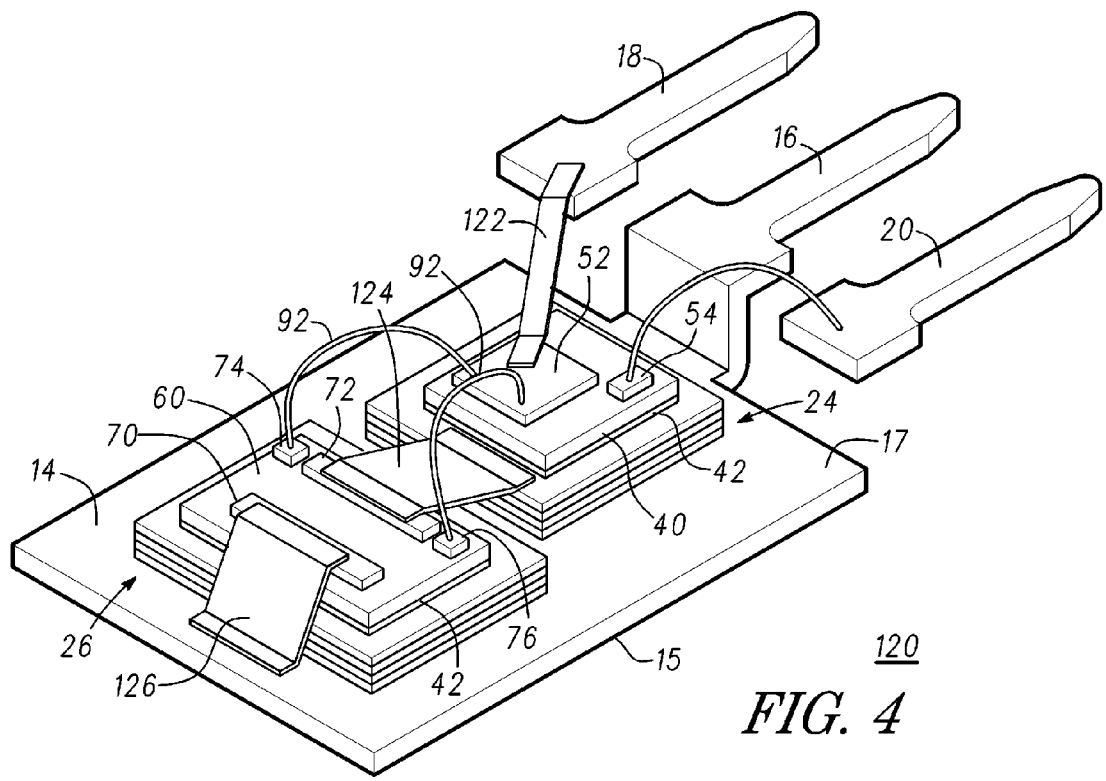
FIG. 4 is a perspective view of a semiconductor component in a cascode configuration in accordance with another embodiment of the present invention.

FIG. 4 is a perspective view of a semiconductor component 120 in accordance with another embodiment of the present invention. Semiconductor component 120 is similar to semiconductor component 10 except that bond wires 86 have been replaced by an electrically conductive clip 122, bond wires 94 have been replaced by an electrically conductive clip 124, and bond wires 96 have been replaced by an electrically conductive clip 126. Mounting semiconductor chips 40 and 60 to insulated metal substrates 24 and 26, respectively, and mounting insulated metal substrates 24 and 26 to device receiving area 14 have been described with reference to FIGS. 1 and 2. Semiconductor component 120 includes a III-N cascode switch in which the substrate of the III-N semiconductor material is electrically floating and bond pads are not formed over active regions of semiconductor device 60.

Figure 5:
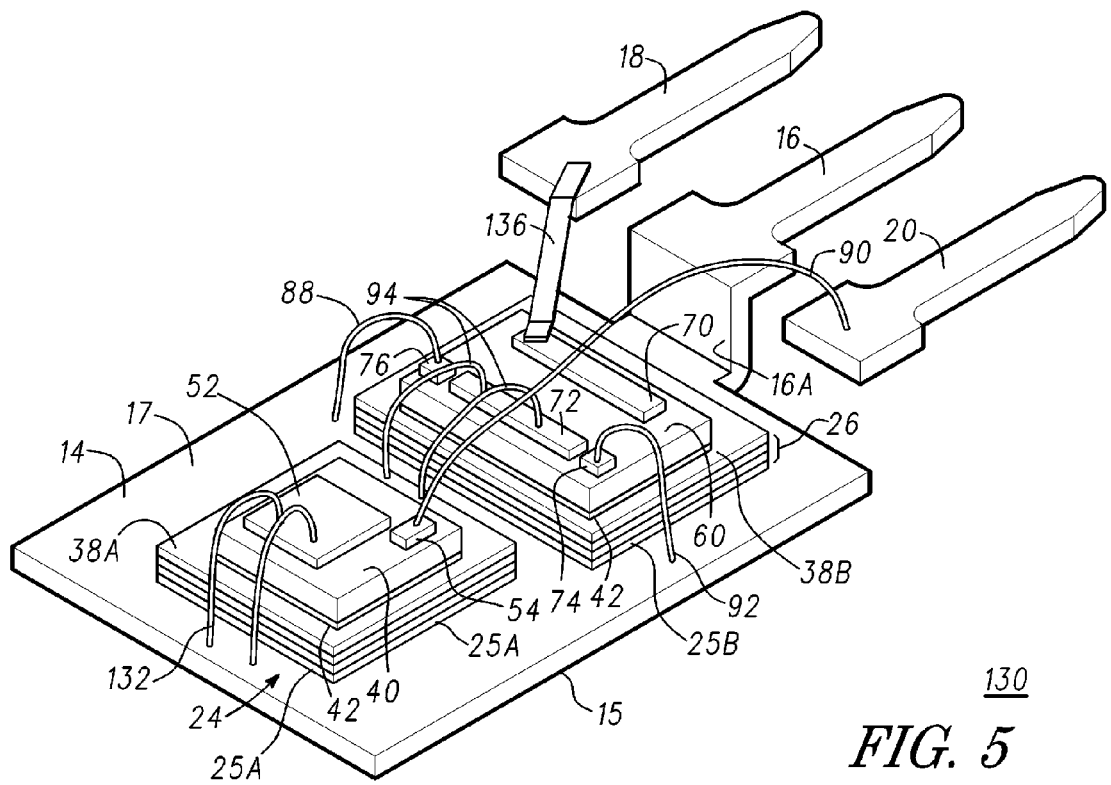
FIG. 5 is a perspective view of a semiconductor component in a cascode configuration in accordance with another embodiment of the present invention.

FIG. 5 is a perspective view of a semiconductor component 130 in accordance with another embodiment of the present invention. Semiconductor component 130 is similar to semiconductor component 10 except that the positions of semiconductor chips 40 and 60 have been switched, semiconductor chip 60 has been rotated 180 degrees, and the leadframe lead integral with die receiving area 14 is configured to serve as the source leadframe lead. For the sake of consistency, the positions of insulated metal substrates 24 and 26 have also been switched to preserve the positions of semiconductor chips 40 and 60 on insulated metal substrates 24 and 26, respectively. In addition, the positions of reference characters 16, 18, and 20 have been maintained. However, in FIG. 5, the leadframe lead identified by reference character 16 refers to the source leadframe lead and the leadframe lead identified by reference character 18 refers to the drain leadframe lead.

Source contact 52 of semiconductor device 40 is electrically connected to die receiving area 14 through bond wires 132. Gate contact 76 is electrically connected to die receiving area 14 through bond wire 88 and gate contact 74 of semiconductor device 40 is electrically connected to die receiving area 14 through bond wire 92. Gate contacts 74 and 76 of semiconductor device 60 are electrically connected to source contact 52 through bond wires 88 and 92, respectively, and through bond wires 132. Source electrode 72 is connected to surface 38A of insulated metal substrate 24 through bond wires 94, and drain contact 70 is electrically connected to leadframe lead 18 through bond wires 134. In accordance with the embodiment of FIG. 5, leadframe lead 16 is a source leadframe lead and leadframe lead 18 is a drain leadframe lead. Bond wires may be referred to as wirebonds. It should be noted that in accordance with this embodiment drain contact 50 of semiconductor device 40 (shown in FIG. 2) is electrically connected to surface 38A of insulated metal substrate 24, whereas semiconductor device 60 is electrically connected to insulated metal substrate 26.

Figure 6:
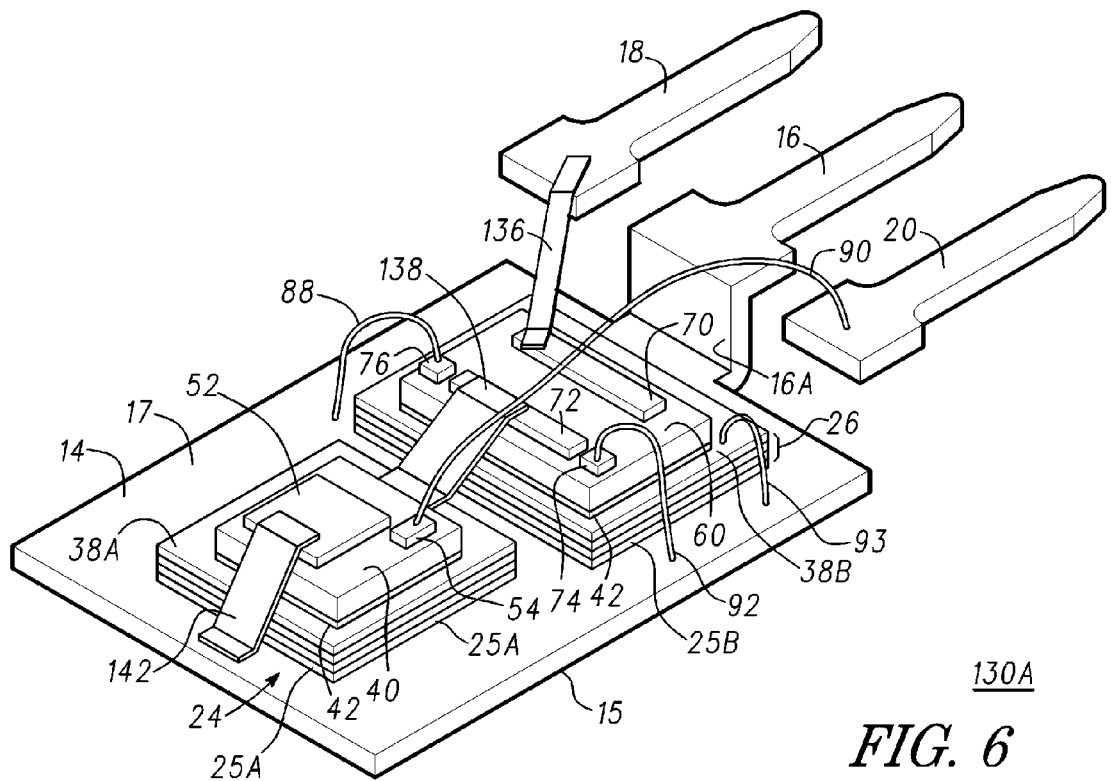
FIG. 6 is a perspective view of a semiconductor component in a cascode configuration in accordance with another embodiment of the present invention.

FIG. 6 is a perspective view of a semiconductor component 130A in accordance with another embodiment of the present invention. Semiconductor component 130A is similar to semiconductor component 130, except that bond wires 134 have been replaced by a clip 136, bond wires 94 have been replaced by a clip 138, and bond wires 132 have been replaced by a clip 142. Thus, clip 136 electrically connects drain contact 70 to drain lead 18, clip 138 electrically connects source contact 72 with surface 138A and thus to drain contact 50 of semiconductor device 40, and clip 142 electrically connects source contact 52 of semiconductor device 40 surface 38A of insulated metal substrate 26.

Figure 7:
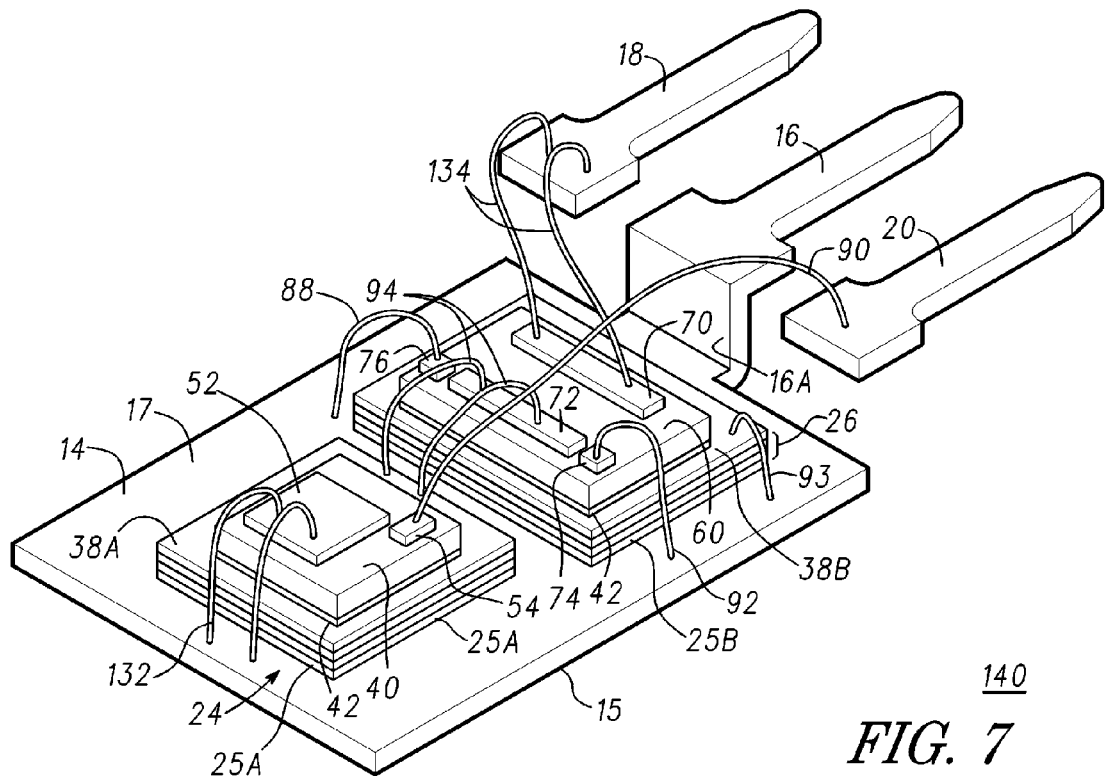
FIG. 7 is a perspective view of a semiconductor component in a cascode configuration in accordance with another embodiment of the present invention.

FIG. 7 is a perspective view of a semiconductor component 140 in accordance with another embodiment of the present invention. Semiconductor component 140 is similar to semiconductor component 130 except that a bond wire 93 electrically connects the substrate of III-N semiconductor material of semiconductor device 60 to surface 38A of insulated metal substrate 26 and thus to source contact 52 of semiconductor device 40 through bond wires 132.

Figure 8:
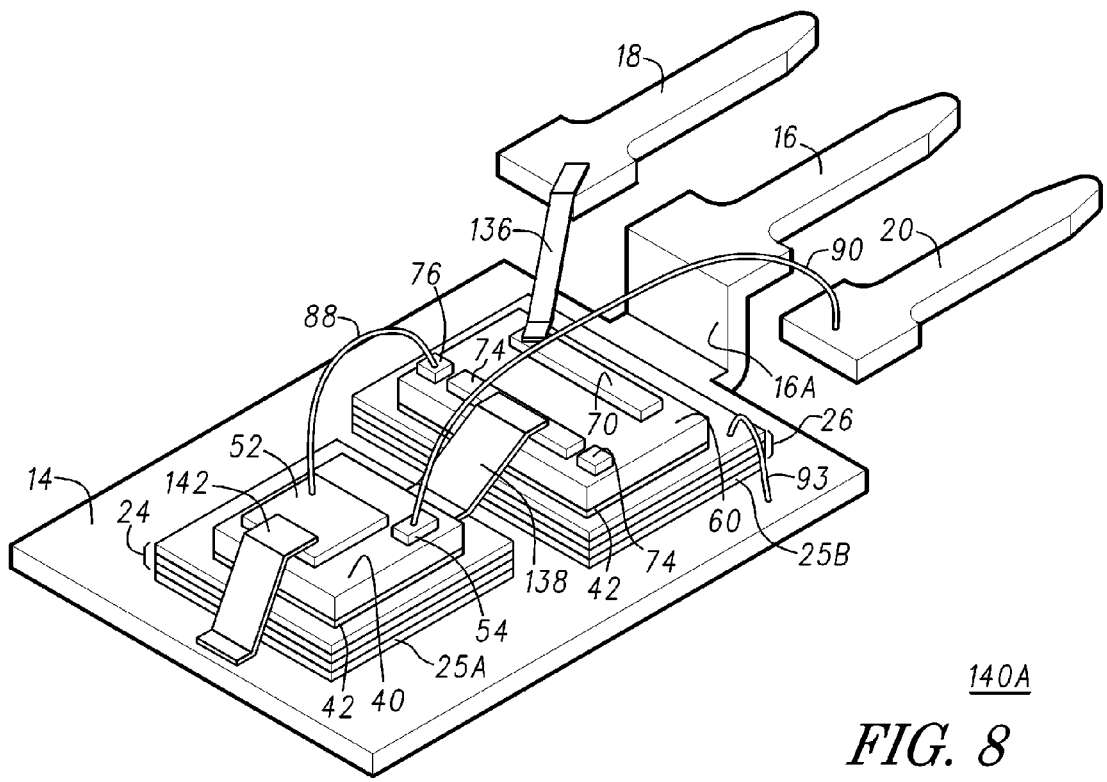
FIG. 8 is a perspective view of a semiconductor component in a cascode configuration in accordance with another embodiment of the present invention.

FIG. 8 is a perspective view of a semiconductor component 140A in accordance with another embodiment of the present invention. Semiconductor component 140A is similar to semiconductor component 140 except that bond wires 132 have been replaced by an electrically conductive clip 142, bond wires 94 have been replaced by an electrically conductive clip 138, and bond wires 134 have been replaced by an electrically conductive clip 136. It should be noted that mounting semiconductor chips 40 and 60 to insulated metal substrates 24 and 26, respectively, and mounting insulated metal substrates 24 and 26 to device receiving area 14 have been described with reference to FIGS. 1 and 2. Thus, semiconductor component 140 includes a III-N cascode switch in which the substrate of the III-N semiconductor material is electrically connected to source contact 52 of semiconductor device 40 and bond pads are not formed over active regions of semiconductor device 60.

Figure 9:
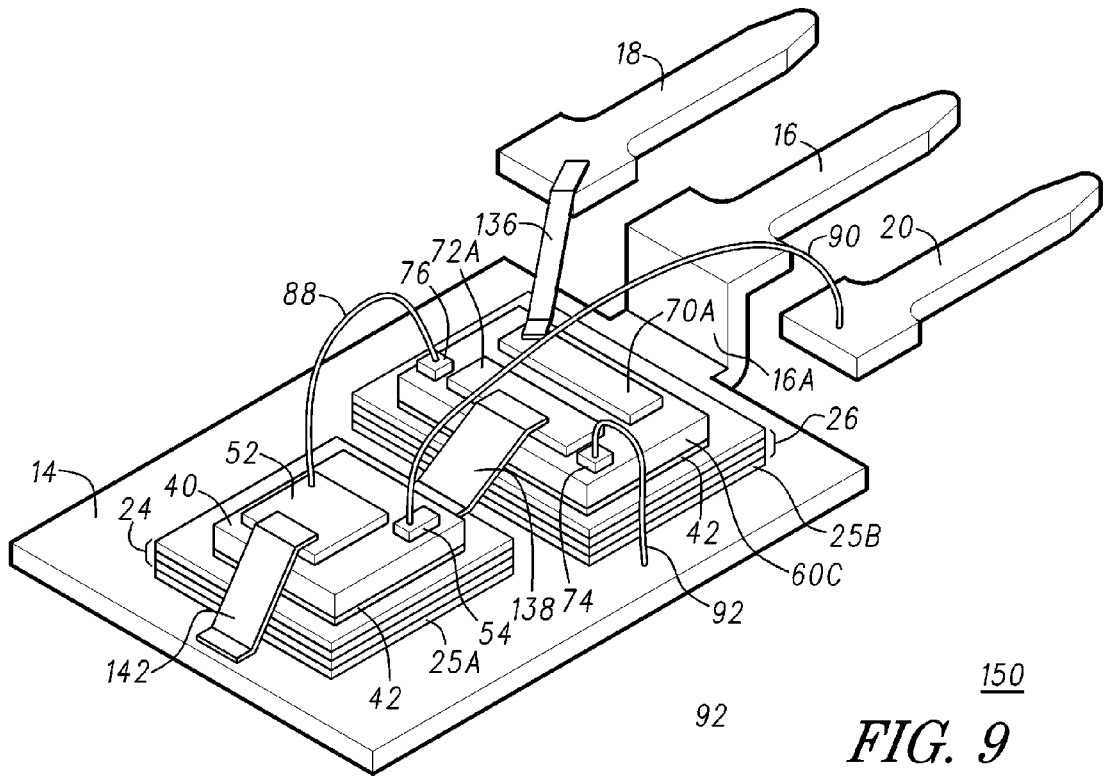
FIG. 9 is a perspective view of a semiconductor component in a cascode configuration in accordance with another embodiment of the present invention.

FIG. 9 is a perspective view of a semiconductor component 150 in accordance with another embodiment of the present invention. Semiconductor component 150 is similar to semiconductor component 130A except that drain electrode 70 and source electrode 72 have been replaced by electrodes 70A and 72A that extend over active areas of III-N semiconductor device 60. Thus, semiconductor component 150 includes a III-N cascode switch in which the substrate of the III-N semiconductor material is electrically floating and bond pads are formed over active regions of semiconductor device 60.

Figure 10:
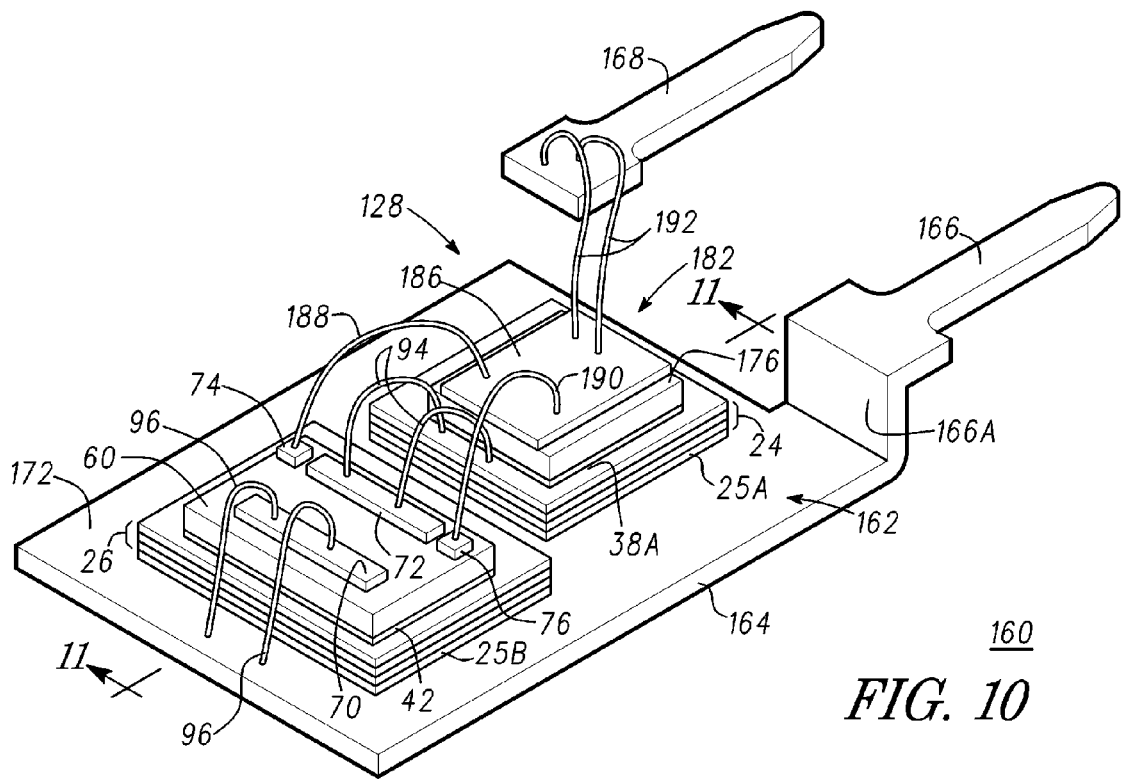
FIG. 10 is a perspective view of a semiconductor component in a cascode configuration in accordance with another embodiment of the present invention.
Figure 11:
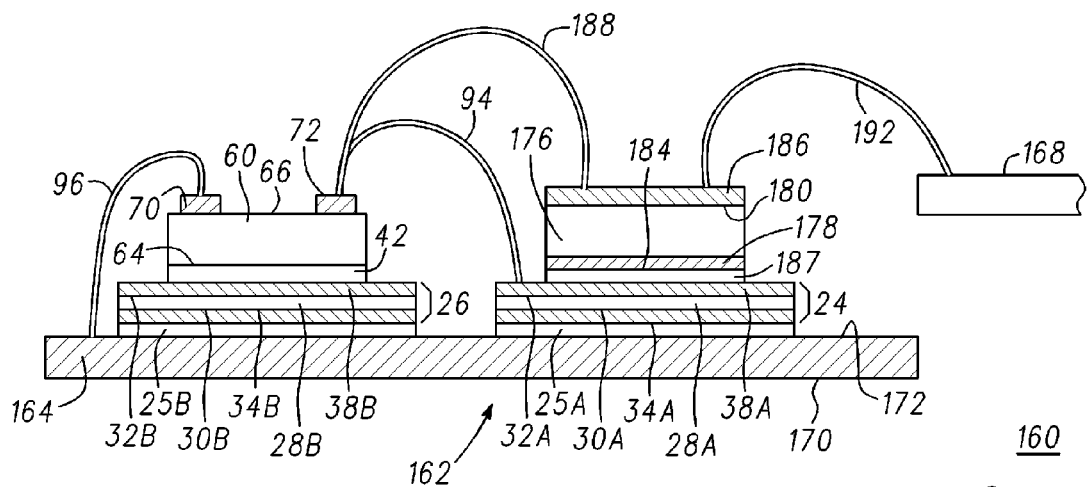
FIG. 11 is a cross-sectional view of the semiconductor component of FIG. 10 taken along section line 11-11 of FIG. 10.

FIG. 10 is a perspective view of a semiconductor component 160 in accordance with another embodiment of the present invention. FIG. 11 is a cross-sectional view of semiconductor component 160 taken along section line 11-11 of FIG. 10. Semiconductor component 160 is similar to semiconductor component 10 in that semiconductor chip 60 is mounted to insulated metal substrate 26, which is bonded to a device receiving area 162 of a leadframe 164 through die attach material 25B, which has been described with reference to FIGS. 1 and 2. Leadframe 164 comprises device receiving area 162 and leadframe leads 166 and 168, wherein device receiving area 162 and leadframe lead 166 are integrally formed with each other, i.e., device receiving area 162 and leadframe lead 166 are derived from an electrically conductive material wherein a portion of the electrically conductive material serves as device receiving area 162 and another portion of the electrically conductive material serves as leadframe lead 166. Device receiving area 164 has opposing surfaces 170 and 172. In accordance with an embodiment, the electrically conductive material is copper. Leadframe lead 166 includes a connector portion 166A that connects leadframe lead 166 to device receiving area 164. Leadframe lead 168 is electrically separated from leadframe lead 166. By way of example, leadframe lead 166 and leadframe lead 168 are in the same plane and device received area 172 is in a different plane from leadframe leads 166 and 168. It should be noted that leadframe 164 is illustrated and described as a single element; however, it may be a portion singulated from a leadframe strip and that leadframe 164 conforms with through hole package outlines such as a TO-220 outline, a TO-247 outline, a TO-264 outline, a TO-257 outline, or the like.

A semiconductor chip 176 having opposing surfaces 178 and 180 is bonded to device receiving area 162 of leadframe 164. By way of example, the semiconductor device is a diode having a cathode 184 formed on surface 178 and an anode 186 formed on surface 180. In accordance with embodiments in which a discrete semiconductor device such as for example, a diode, is formed from semiconductor chip 176, semiconductor chip 176 may be referred to as a semiconductor device. Semiconductor chip 176 is bonded to insulated metal substrate 24 using an electrically conductive material such as solder, a conductive epoxy, an electrically conductive die attach material, or the like. Cathode 184 of diode 176 is electrically connected to insulated metal substrate 24 by an electrically conductive material 187. Anode 186 of diode 176 is electrically connected to gate electrodes 74 and 76 of III-N semiconductor device 60 through bond wires 188 and 190, respectively, and to leadframe lead 168 through bond wires 192. Drain electrode 70 of III-N semiconductor device 60 is electrically connected to surface 172 of device receiving area 162 through bond wires 96. Thus, semiconductor component 160 includes a III-N cascode rectifier in which the substrate of the III-N semiconductor material is floating and bond pads are not formed over active regions of semiconductor device 60.

Figure 12:
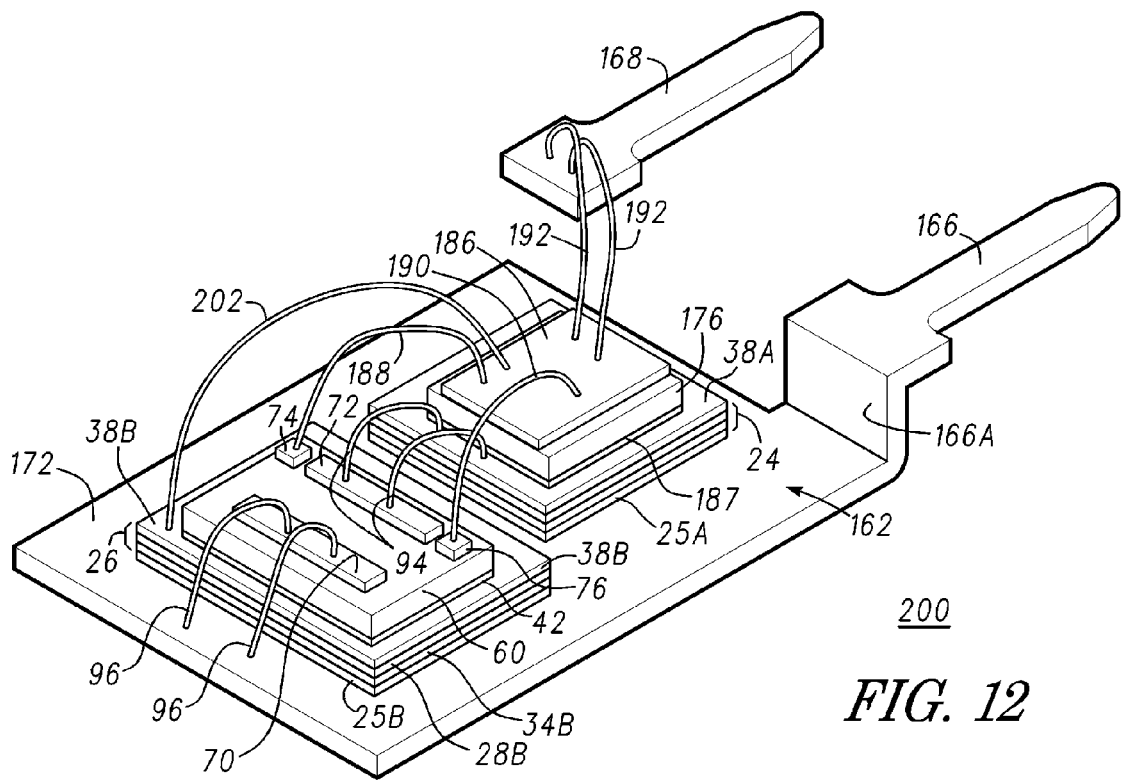
FIG. 12 is a perspective view of a semiconductor component in a cascode configuration in accordance with another embodiment of the present invention.

FIG. 12 is a perspective view of a semiconductor component 200 in accordance with another embodiment of the present invention. Semiconductor component 200 is similar to semiconductor component 160 except that semiconductor component 200 includes a bond wire 202 electrically connecting anode 186 of diode 176 with surface 38B of insulated metal substrate 26. It should be noted that mounting semiconductor chips 176 and 60 to insulated metal substrates 24 and 26, respectively, and mounting insulated metal substrates 24 and 26 to device receiving area 162 have been described with reference to FIGS. 8 and 9. Bond wire 202 electrically connects anode 186 of diode 176 to the body of semiconductor material of semiconductor device 60. Thus, semiconductor component 200 includes a III-N cascode rectifier in which the substrate of the III-N semiconductor material is connected to the anode of diode 176 and may be grounded if the anode of diode 176 is grounded. In addition, bond pads are not formed over active regions of semiconductor device 176. It should be noted that leadframe 12 is illustrated and described as a single element; however, it may be a portion singulated from a leadframe strip and that leadframe 12 conforms with through hole package outlines such as a TO-220 outline, a TO-247 outline, a TO-264 outline, a TO-257 outline, or the like.

Figure 13:
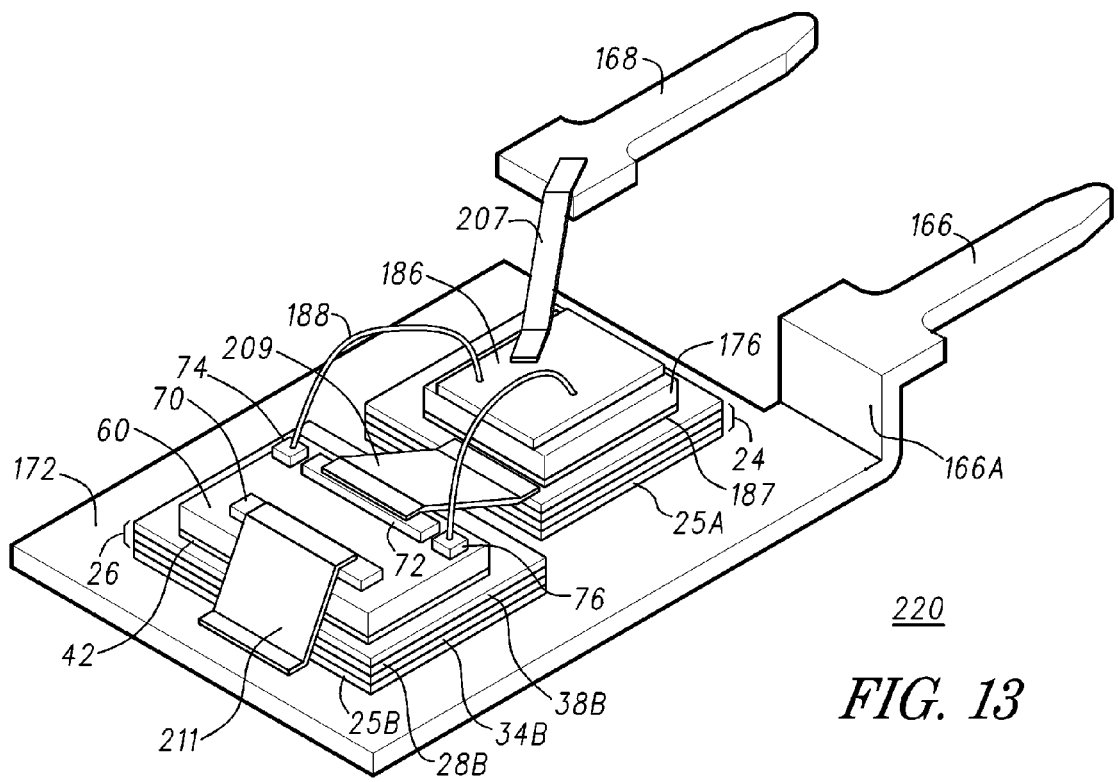
FIG. 13 is a perspective view of a semiconductor component in a cascode configuration in accordance with another embodiment of the present invention.

FIG. 13 is a perspective view of a semiconductor component 220 in accordance with another embodiment of the present invention. Semiconductor component 220 is similar to semiconductor component 160 except that bond wires 94 have been replaced by an electrically conductive clip 209, bond wires 96 have been replaced by an electrically conductive clip 211, and bond wires 192 have been replaced by an electrically conductive clip 207. It should be noted that mounting semiconductor chips 176 and 60 to insulated metal substrates 24 and 26, respectively, and mounting insulated metal substrates 24 and 26 to device receiving area 162 have been described with reference to FIGS. 8 and 9. Thus, semiconductor component 220 includes a III-N cascode rectifier in which the substrate of the III-N semiconductor material is electrically floating.

Figure 14:
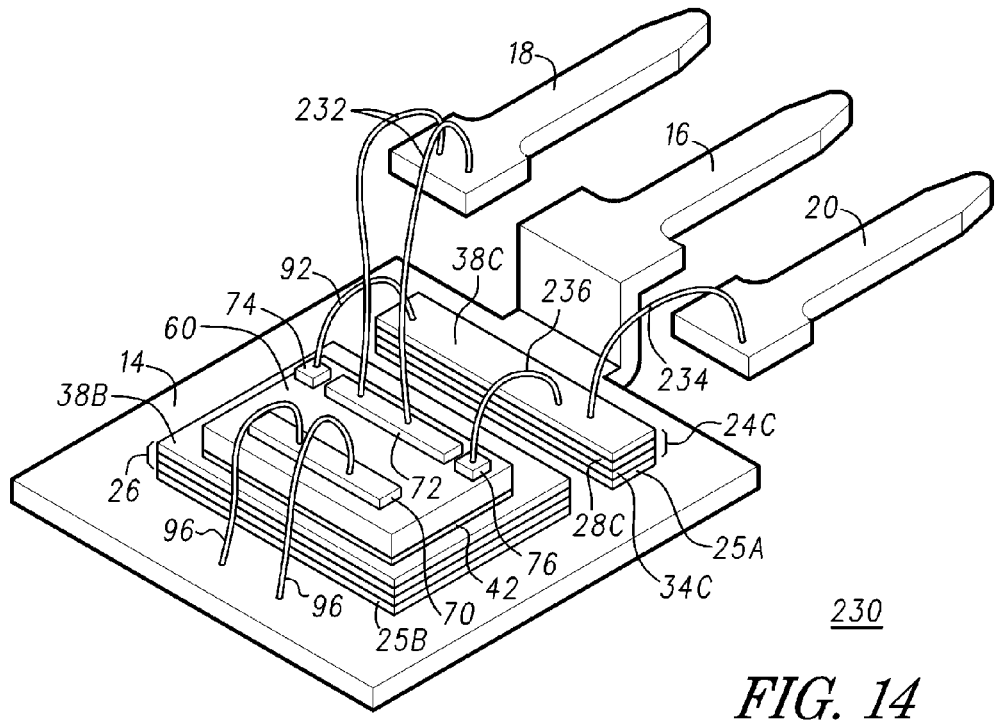
FIG. 14 is a perspective view of a semiconductor component in a cascode configuration in accordance with another embodiment of the present invention.

FIG. 14 is a perspective view of a semiconductor component 230 in accordance with another embodiment of the present invention. Semiconductor component 230 is similar to semiconductor component 10 except that semiconductor chip 40 is absent from semiconductor component 230 and insulated metal substrate 24 has been replaced by an insulated metal substrate 24A. Insulated metal substrate 24A is similar to insulated metal substrate 24 except that layers 28A, 34A, and 38A have a narrower width. Layers 28A, 34A, and 38A have been identified by reference characters 28C, 34C, and 38C, respectively. Thus, semiconductor component 230 includes semiconductor chip 60 electrically bonded to insulated metal substrate 26. Gate contact 74 of semiconductor device 60 is electrically connected to surface 38C of electrical interconnect 24C through a bond wire 92, source contact 72 is electrically connected to leadframe lead 18 through bond wires 232, drain contact 70 is electrically connected to device receiving area 14 through bond wires 96, and surface 38C of electrical interconnect 24C is electrically connected to leadframe lead 20 through a bond wire 234. Gate contact 76 is electrically connected to leadframe lead 20 through bond wire 236, and gate contact 76 is electrically connected to leadframe lead 20 through a bond wire 236. Gate contact 74 is electrically conducted to gate contact 76 through a metallization system, not shown. Bond wires may be referred to as wirebonds. It should be noted that in accordance with this embodiment semiconductor device 60 is electrically connected to insulated metal substrate 26C. Thus, semiconductor component 230 includes a discrete III-N semiconductor device in which the substrate of the III-N semiconductor material is electrically floating and bond pads are not formed over active regions of semiconductor device 60.

Figure 15:
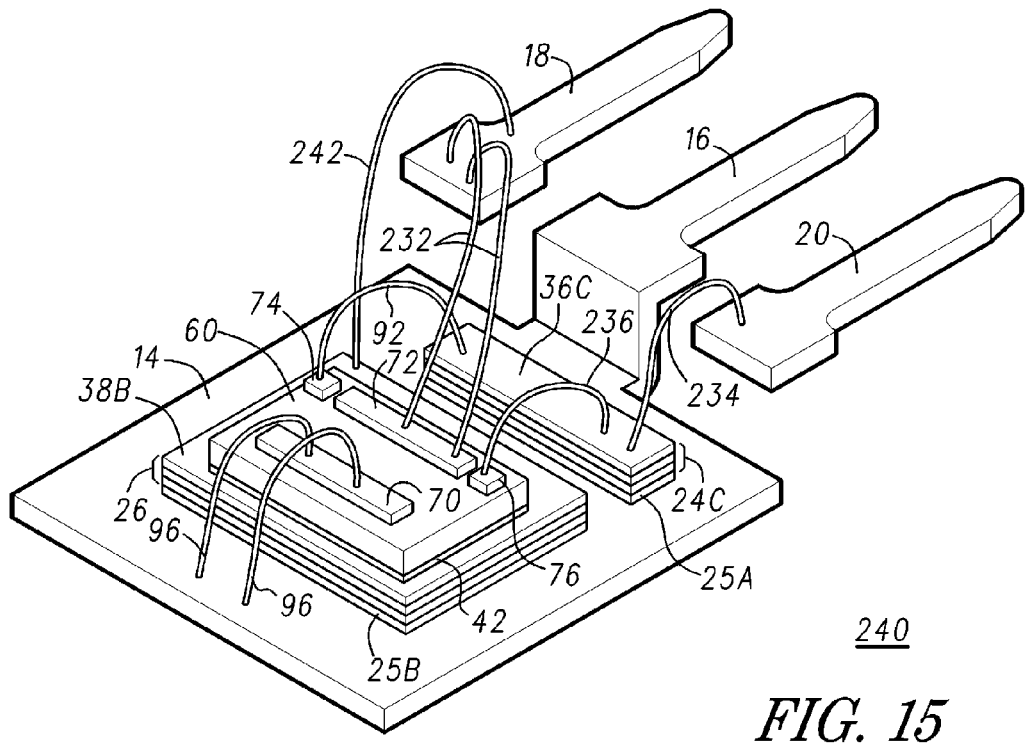
FIG. 15 is a perspective view of a semiconductor component in a cascode configuration in accordance with another embodiment of the present invention.

FIG. 15 is a perspective view of a semiconductor component 240 in accordance with another embodiment of the present invention. Semiconductor component 240 is similar to semiconductor component 230 except that semiconductor component 240 includes a bond wire 242 connecting leadframe lead 18 to surface 38B of insulated metal substrate 26. It should be noted that mounting semiconductor chip 60 to insulated metal substrate 26 and mounting insulated metal substrate 26 to device receiving area 162 have been described with reference to FIGS. 8 and 9. Bond wire 232 electrically connects source electrode 72 to leadframe lead 18. Hence the source, of semiconductor device 60 is connected to the body of the semiconductor material of semiconductor device 60. Thus, semiconductor component 240 includes a discrete III-N semiconductor device in which the substrate of the III-N semiconductor material is connected to source electrode 72 and may be grounded if source electrode 72 is grounded. Bond pads are not formed over active regions of semiconductor device 60.

Figure 16:
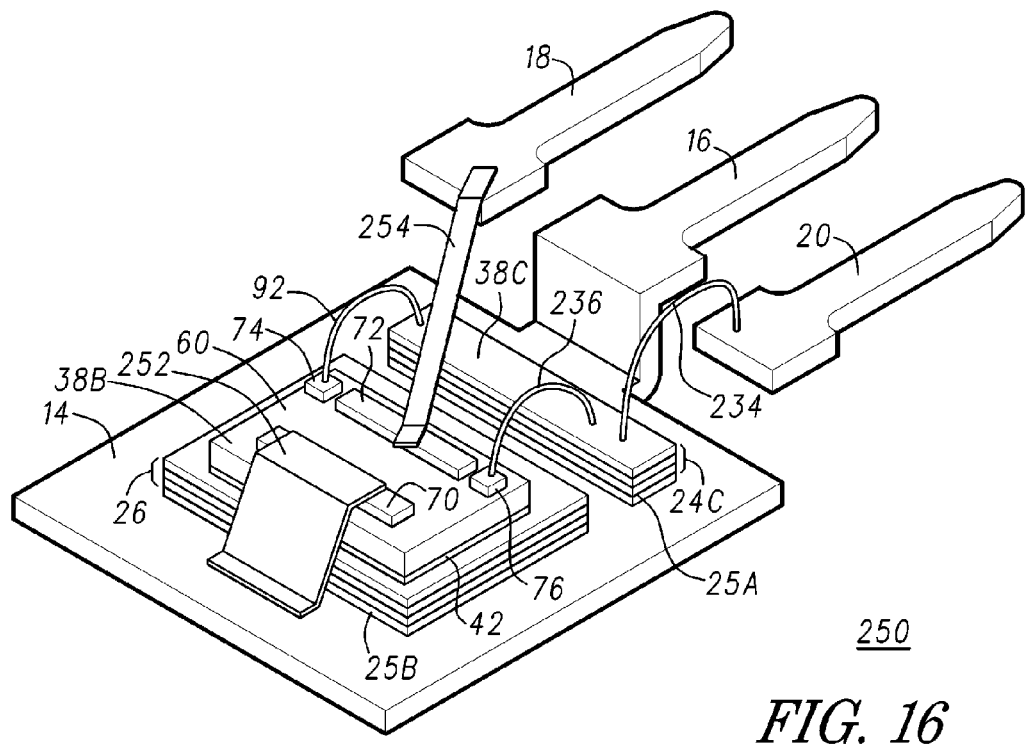
FIG. 16 is a perspective view of a semiconductor component in a cascode configuration in accordance with another embodiment of the present invention.

FIG. 16 is a perspective view of a semiconductor component 250 in accordance with another embodiment of the present invention. Semiconductor component 250 is similar to semiconductor component 230 except that bond wires 96 have been replaced by an electrically conductive clip 252 and bond wires 232 have been replaced by an electrically conductive clip 254. It should be noted that mounting semiconductor chip 60 to insulated metal substrate 26 and mounting insulated metal substrate 26 to device receiving area 162 have been described with reference to FIGS. 8 and 9. Thus, semiconductor component 250 includes a III-N cascode switch in which the substrate of the III-N semiconductor material is electrically floating and bond pads are not formed over active regions of semiconductor device 60.

Figure 17:
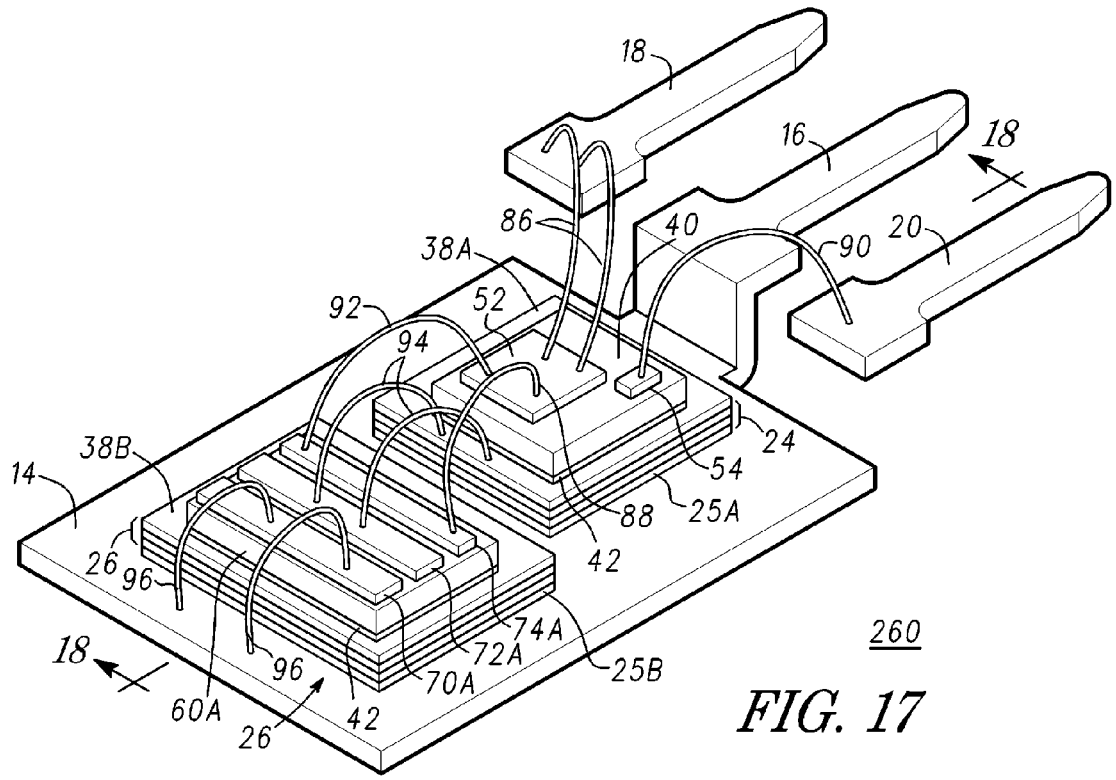
FIG. 17 is a perspective view of a semiconductor component in a cascode configuration in accordance with another embodiment of the present invention.
Figure 18:
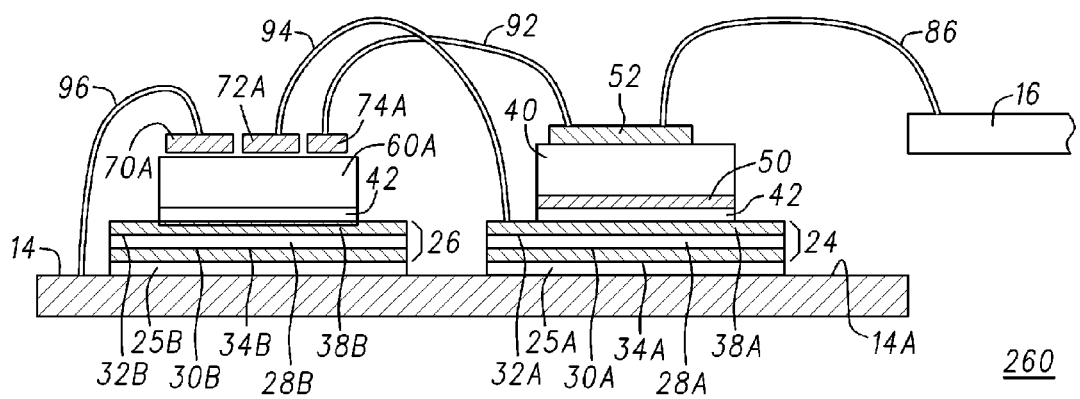
FIG. 18 is a cross-sectional view of the semiconductor component of FIG. 17 taken along section line 18-18 of FIG. 17.

FIG. 17 is a perspective view of a semiconductor component 260 in accordance with another embodiment of the present invention. FIG. 18 is a cross-sectional view of semiconductor component 260 taken along section line 18-18 of FIG. 17. For the sake of clarity, FIGS. 17 and 18 are described together. Semiconductor component 260 is similar to semiconductor component 10 except that drain electrode 70 and source electrode 72 have been replaced by electrodes 70A and 72A, respectively, that extend over active areas of III-N semiconductor device 60A, and gate electrodes 74 and 76 have been replaced by a gate electrode 74A that extends over active areas of III-N semiconductor device 60A. Reference character A has been appended to reference character 60 to distinguish the III-N semiconductor device of FIG. 15 from the III-N semiconductor device of FIG. 1. Thus, semiconductor component 260 includes a III-N cascode switch in which the substrate of the III-N semiconductor material is electrically floating and bond pads are formed over active regions of semiconductor device 60A.

Figure 19:
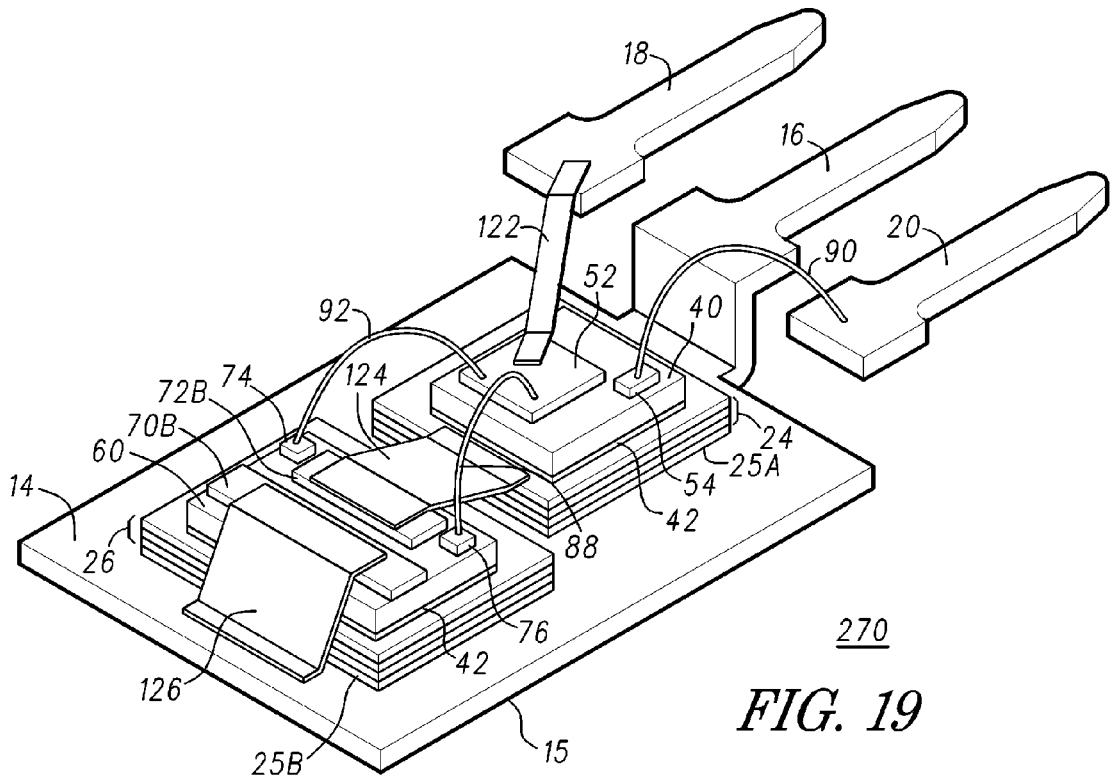
FIG. 19 is a perspective view of a semiconductor component in a cascode configuration in accordance with another embodiment of the present invention.

FIG. 19 is a perspective view of a semiconductor component 270 in accordance with another embodiment of the present invention. Semiconductor component 270 is similar to semiconductor component 10 of FIG. 1 except that drain electrode 70 extends over the active areas of the III-N cascode switch and is therefore identified by reference character 70B; source electrode 72 extends over the active areas of the III-N cascode switch and is therefore identified by reference character 72B; bond wires 86 have been replaced by an electrically conductive clip 122; bond wires 94 have been replaced by an electrically conductive clip 124; and bond wires 96 have been replaced by an electrically conductive clip 126. It should be noted that mounting semiconductor chips 40 and 60 to insulated metal substrates 24 and 26, respectively, and mounting insulated metal substrate 26 to device receiving area 14 have been described with reference to FIGS. 1 and 2. Thus, semiconductor component 270 includes a III-N cascode switch in which the substrate of the III-N semiconductor material is electrically floating and bond pads are not formed over active regions of semiconductor device 60.

Figure 20:
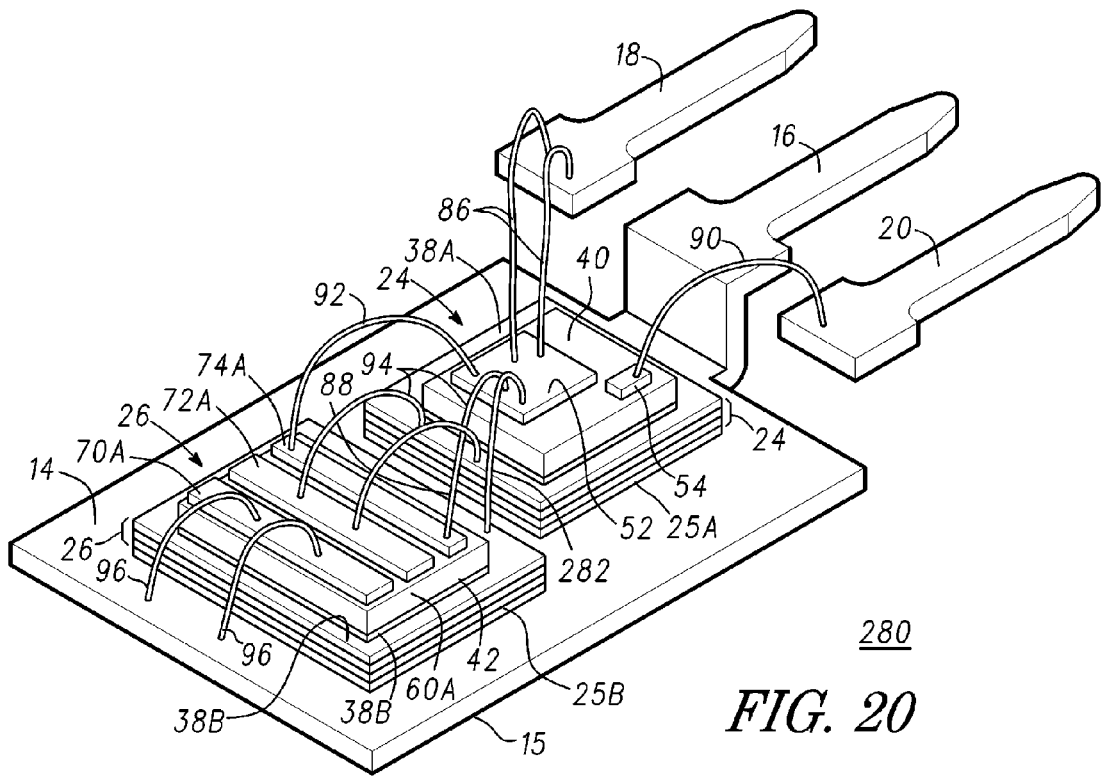
FIG. 20 is a perspective view of a semiconductor component in a cascode configuration in accordance with another embodiment of the present invention.

FIG. 20 is a perspective view of a semiconductor component 280 in accordance with another embodiment of the present invention. Semiconductor component 280 is similar to semiconductor component 260 except that semiconductor component 280 includes a bond wire 282 connecting source electrode 52 with surface 38B of insulated metal substrate 26. It should be noted that mounting semiconductor chips 40 and 60 to insulated metal substrates 24 and 26, respectively, and mounting insulated metal substrates 24 and 26 to device receiving area 14 have been described with reference to FIGS. 1 and 2. Bond wire 282 electrically connects source electrode 52, hence the source, of semiconductor device 40 to the body of semiconductor material of semiconductor device 60. Thus, semiconductor component 100 includes a III-N cascode switch in which the substrate of the III-N semiconductor material is connected to source electrode 52 and bond pads are formed over active regions of semiconductor device 60. It should be noted that the substrate of the III-N semiconductor material may be grounded if source electrode 52 is grounded.

Figure 21:
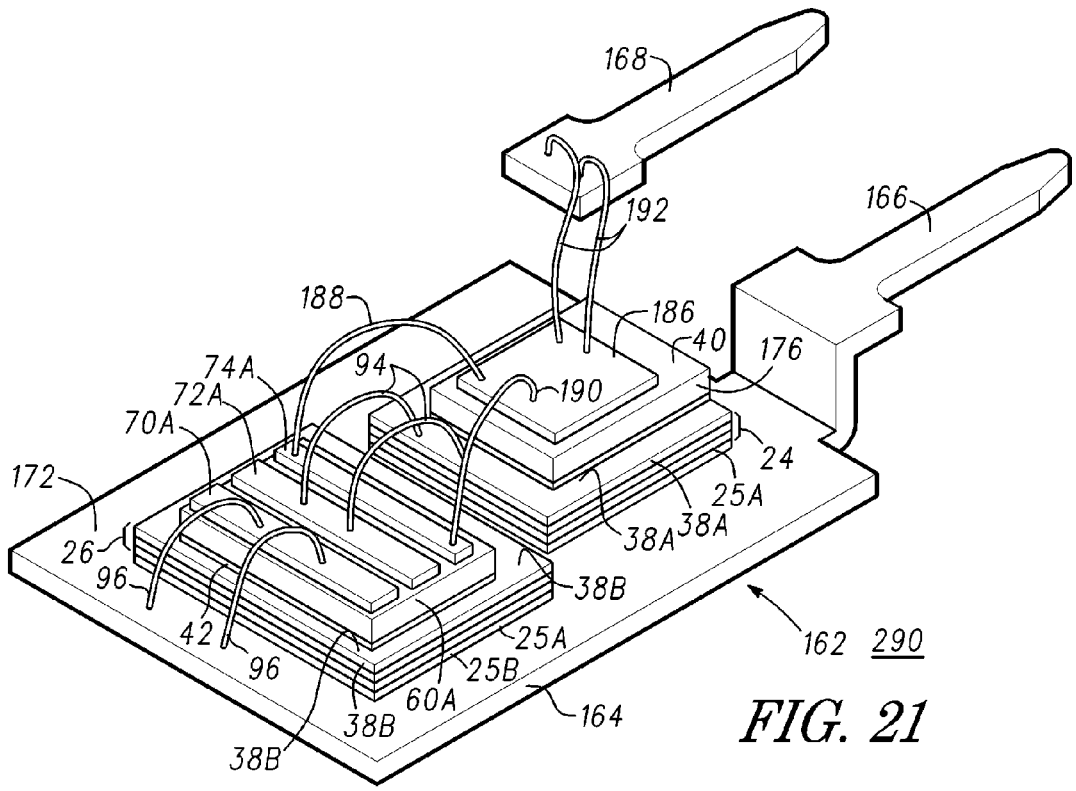
FIG. 21 is a perspective view of a semiconductor component in a cascode configuration in accordance with another embodiment of the present invention.

FIG. 21 is a perspective view of a semiconductor component 290 in accordance with another embodiment of the present invention. Semiconductor component 290 is similar to semiconductor component 260 except semiconductor device 40 has been replaced with semiconductor device 176 (described with reference to FIG. 8). Cathode 184 of diode 176 is electrically connected to surface 36A of insulated metal substrate 24 (shown in FIGS. 1 and 2). Anode 186 of diode 176 is electrically connected to gate contact 74A of III-N semiconductor device 60 through bond wires 188 and 190 and to leadframe lead 168 through bond wires 192. Drain contact 70A of III-N semiconductor device 60 is electrically connected to device receiving area 162 through bond wires 96, source contact 72A is connected to surface 38A of insulated metal substrate 24 through bond wires 94. Thus, semiconductor component 290 includes a III-N cascode switch in which the substrate of the III-N semiconductor material is electrically floating and bond pads are formed over active regions of semiconductor device 60.

Figure 22:
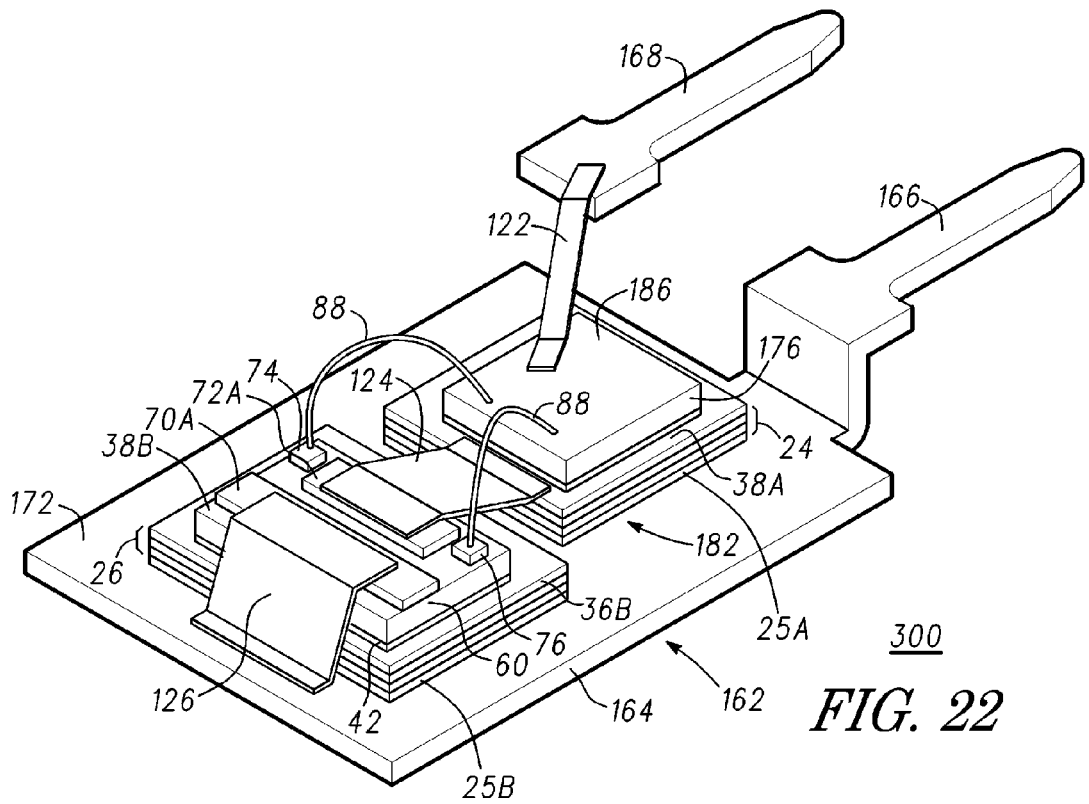
FIG. 22 is a perspective view of a semiconductor component in a cascode configuration in accordance with another embodiment of the present invention.

FIG. 22 is a perspective view of a semiconductor component 300 in accordance with another embodiment of the present invention. Semiconductor component 300 is similar to semiconductor component 290 (shown in FIG. 21) in having diode 176 mounted to insulated metal substrate 24 and similar to semiconductor component 270 (shown in FIG. 19) in that semiconductor device 60 has bond pads 70A and 72A formed over active regions of III-N semiconductor device 68 and in having gate bond pads 74 and 76. Cathode 184 of diode 176 is electrically connected to surface 38A of insulated metal substrate 24. Anode 186 of diode 176 is electrically connected to gate contacts 74 and 76 of III-N semiconductor device 60 through bond wires 88 and to leadframe lead 168 through an electrically conductive clip 122. Drain contact 70A of III-N semiconductor device 60 is electrically connected to device receiving area 162 through clip 126, source contact 72A is electrically connected to surface 38A of insulated metal substrate 24 through electrically conductive clip 124. Thus, semiconductor component 300 includes a III-N cascode switch in which the III-N semiconductor material is electrically floating and bond pads 70A and 72A are formed over active regions of semiconductor device 60.

Figure 23:
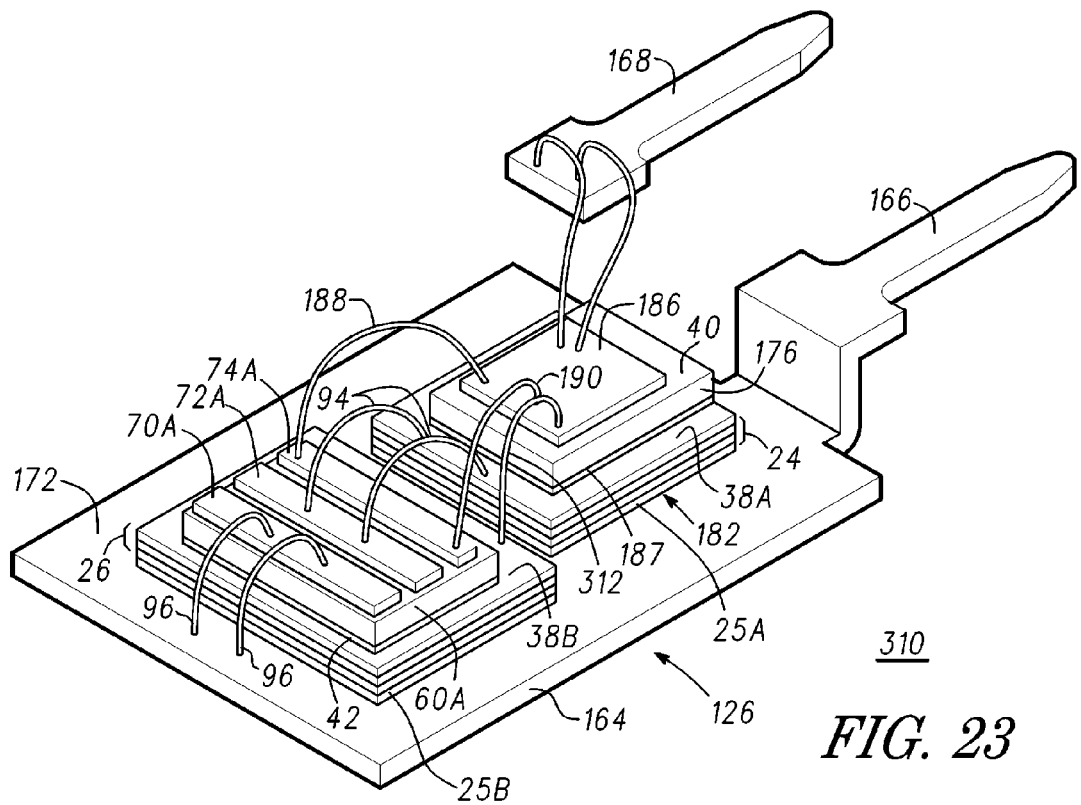
FIG. 23 is a perspective view of a semiconductor component in a cascode configuration in accordance with another embodiment of the present invention.

FIG. 23 is a perspective view of a semiconductor component 310 in accordance with another embodiment of the present invention. Semiconductor component 310 is similar to semiconductor component 290 except anode 186 is electrically connected to surface 38B of insulated metal substrate 26 through a bond wire 312. Thus, semiconductor component 310 includes a III-N cascode switch in which the substrate of the III-N semiconductor material is electrically grounded and bond pads 70A, 72A, and 74A are formed over active regions of semiconductor device 60.

Figure 24:
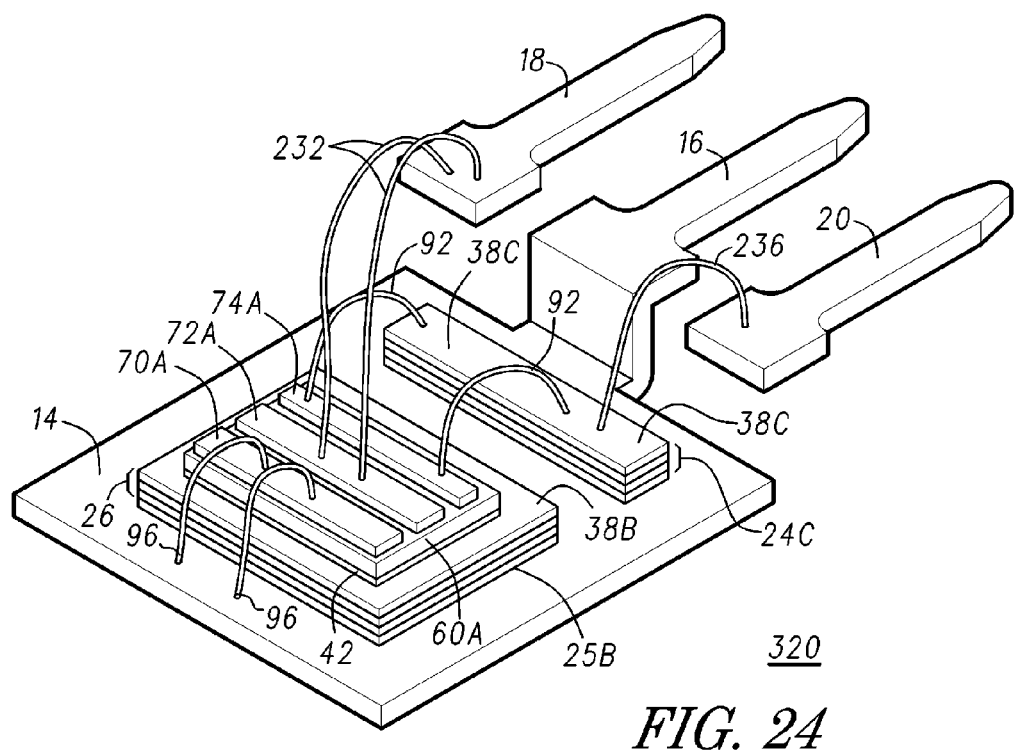
FIG. 24 is a perspective view of a semiconductor component in a cascode configuration in accordance with another embodiment of the present invention.

FIG. 24 is a perspective view of a semiconductor component 320 in accordance with another embodiment of the present invention. Semiconductor component 320 is similar to semiconductor component 230 except that the drain, gate, and source electrodes are formed over active regions. Thus, the drain electrode is identified by reference character 70A, the source electrode is identified by reference character 72A, and the gate electrodes are identified by reference character 74A. Thus, drain electrode 70A is electrically connected to device receiving area 14 by bond wires 96, source electrode 72A is electrically connected to leadframe lead 18 by bond wires 232, gate electrode 74A is electrically connected to surface 38A of insulated metal substrate 24 by bond wires 92. Thus, semiconductor component 320 includes a discrete III-N field effect transistor in which the substrate of the discrete III-N field effect transistor is electrically floating and bond pads 70A, 72A, and 74A are formed over active regions of semiconductor device 68.

Figure 25:
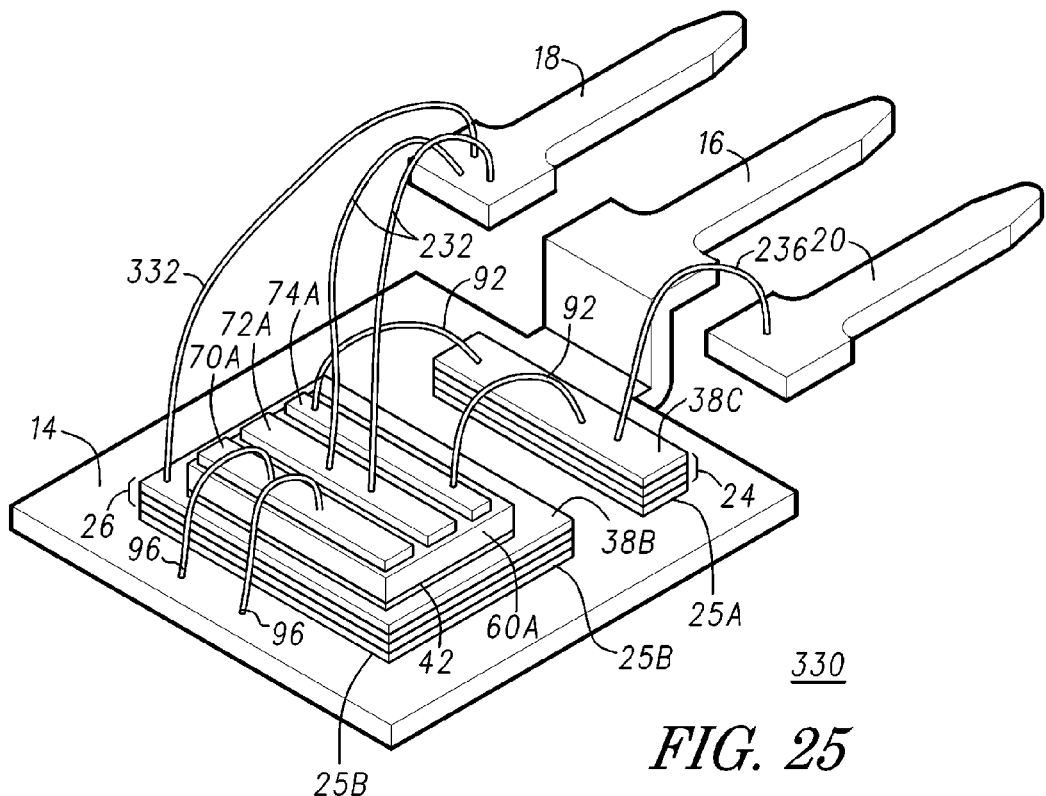
FIG. 25 is a perspective view of a semiconductor component in a cascode configuration in accordance with another embodiment of the present invention.

FIG. 25 is a perspective view of a semiconductor component 330 in accordance with another embodiment of the present invention. Semiconductor component 330 is similar to semiconductor component 320 except that leadframe lead 18 is electrically coupled to surface 38A of insulated metal substrate 26 through a bond wire 332. Thus, semiconductor component 330 includes a discrete III-N field effect transistor in which the substrate of the discrete III-N field effect transistor is electrically grounded and bond pads 70A, 72A, and 74A are formed over active regions of semiconductor device 60A.

Figure 26:
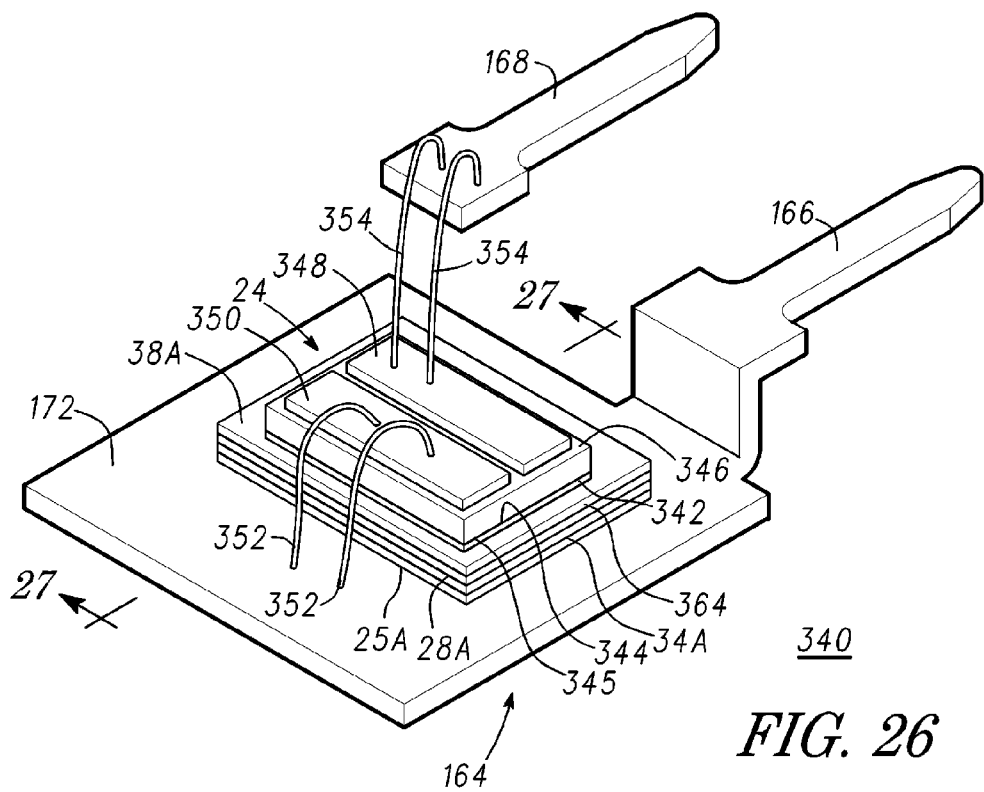
FIG. 26 is a perspective view of a semiconductor component in a cascode configuration in accordance with another embodiment of the present invention.
Figure 27:
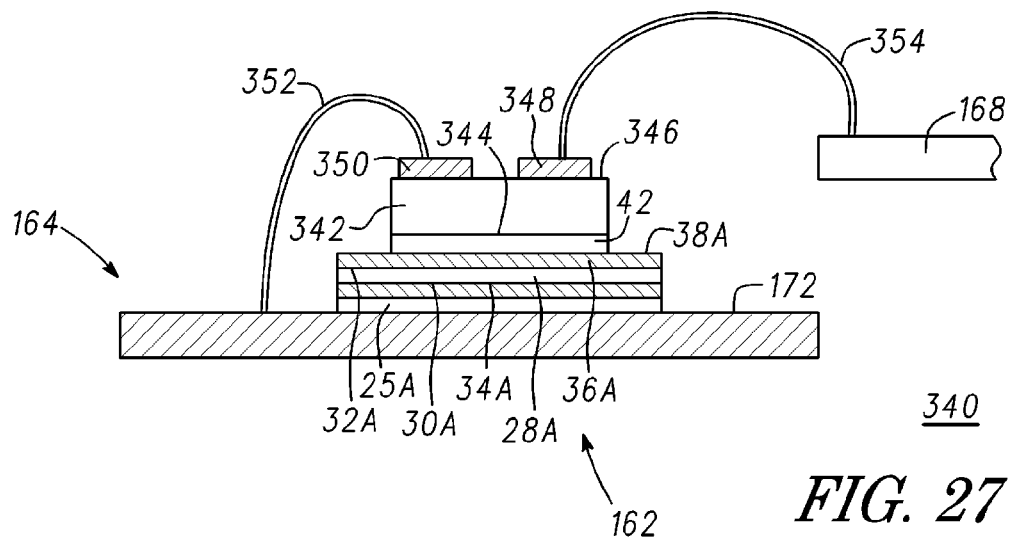
FIG. 27 is a cross-sectional view of the semiconductor component of FIG. 26 taken along section line 27-27 of FIG. 26.

FIG. 26 is a perspective view of a semiconductor component 340 in accordance with another embodiment. FIG. 27 is a cross-sectional view of semiconductor component 340 taken along section line 27-27 of FIG. 26. FIGS. 26 and 27 are described together. Semiconductor component 340 comprises a semiconductor device 342 mounted to device receiving area 162 of leadframe 164. Leadframe 164 includes leadframe leads 166 and 168 and has been described with reference to FIGS. 8 and 9. In accordance with an embodiment, semiconductor device 342 is diode manufactured from a III-N semiconductor material having opposing surfaces 344 and 346. Surface 344 is bonded to surface 38A of insulated metal substrate 24. As described with reference to FIGS. 1 and 2, insulated metal substrate 24 is bonded to device receiving area 162 through an electrically conductive material 42 such as, for example, solder. III-N diode 342 has an anode 348 formed on a portion of surface 346 and a cathode 350 formed on another portion of surface 346. Anode 348 is electrically connected to leadframe lead 168 through bond wires 354 and cathode 350 is electrically connected to device receiving area 162 through a bond wires 352. Thus, semiconductor component 340 includes a discrete III-N diode in which the substrate of the discrete III-N diode is electrically floating and the bond pads of anode 348 and cathode 350 are formed over active regions of semiconductor device 342.

Figure 28:
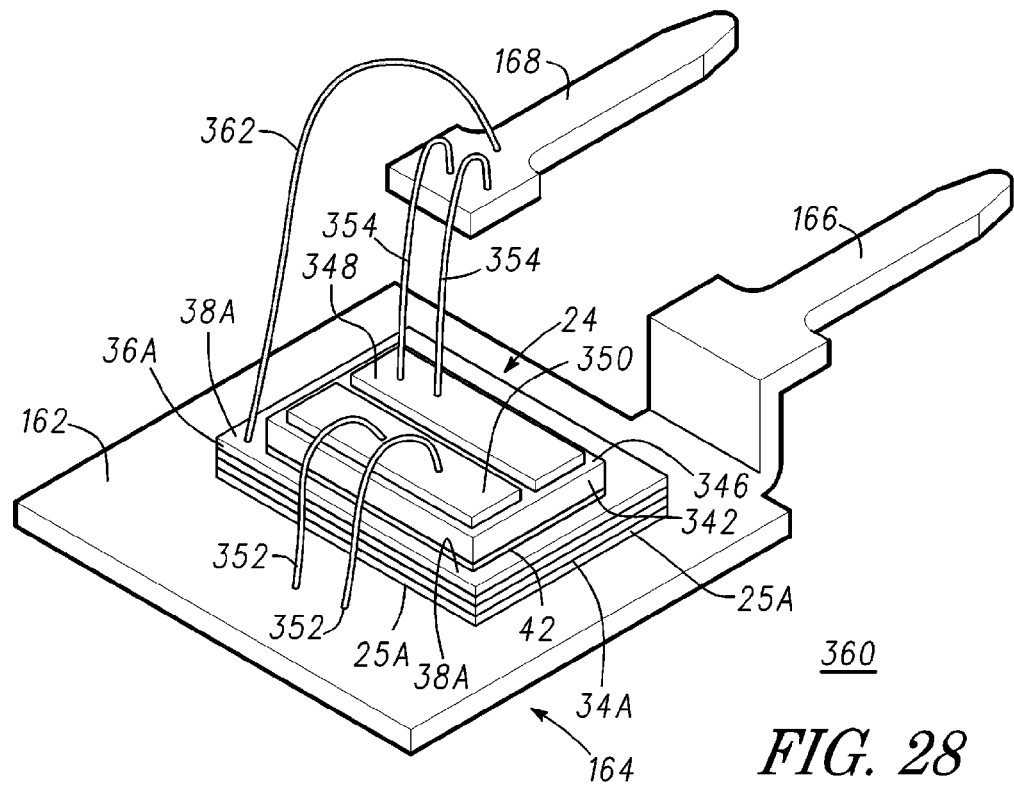
FIG. 28 is a perspective view of a semiconductor component in a cascode configuration in accordance with another embodiment of the present invention.

FIG. 28 is a perspective view of a semiconductor component 360 in accordance with another embodiment of the present invention. Semiconductor component 360 is similar to semiconductor component 340 except that leadframe lead 168 is electrically coupled to surface 38A of insulated metal substrate 26 through a bond wire 362. Thus, semiconductor component 360 includes a discrete III-N diode 342 in which the substrate of the discrete III-N diode is electrically grounded and bond pads 348 and 350 are formed over active regions of semiconductor device 342.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component having at least first and second terminals, comprising:
    a leadframe having a die receiving area and at least a first leadframe lead and a second leadframe lead, the first leadframe lead serving as the first terminal of the semiconductor component and the second leadframe lead serving as the second terminal of the semiconductor component;
    at least one mounting structure having a first surface and a second surface, the first surface of the at least one mounting structure bonded to a first portion of the die receiving area;
    a first semiconductor device mounted to a first mounting structure, the first semiconductor device having first and second current carrying terminals and configured from a III-N semiconductor material; and
    a first electrical interconnect coupled between the first current carrying terminal of the first semiconductor device and a second portion of the die receiving area.

2. The semiconductor component of claim 1, further including a second electrical interconnect coupled between the second current carrying terminal of the first semiconductor device and the first leadframe lead.

3. The semiconductor component of claim 1, wherein the at least one mounting structure further comprises a second mounting structure having a first surface and a second surface, the second mounting structure coupled to a third portion of the die receiving area.

4. The semiconductor component of claim 3, wherein the first mounting structure comprises:
    a first dielectric layer having a first surface and a second surface, a first layer of electrically conductive material on the first surface of the first dielectric layer, and
    a second layer of electrically conductive material on the second surface of the first dielectric material; and
    wherein the second mounting structure comprises:
    a second dielectric layer having a first surface and a second surface,
    a third layer of electrically conductive material on the first surface of the second dielectric layer, and
    a fourth layer of electrically conductive material on the second surface of the second dielectric layer.

5. The semiconductor component of claim 4, further including a second semiconductor device mounted to the second mounting structure, the second semiconductor device having a control terminal and first and second current carrying terminals and configured from a silicon based material.

6. The semiconductor component of claim 5, wherein the second semiconductor device has a first surface and a second surface, the control terminal of the second semiconductor device formed at a first portion of the first surface of the second semiconductor device and the first current carrying terminal of the second semiconductor device formed at a second portion of the first surface of the second semiconductor device, and the second current carrying terminal of the second semiconductor device formed at the second surface of the second semiconductor device.

7. The semiconductor component of claim 6, further including a second electrical interconnect coupled between the first current carrying terminal of the second semiconductor device and the first leadframe lead.

8. The semiconductor component of claim 7, wherein the first electrical interconnect is one of a first bonding wire and a first clip and the second electrical interconnect is one of a second bonding wire and a second clip.

9. The semiconductor component of claim 8, further including:
    a third electrical interconnect coupled between the control terminal of the second semiconductor device and the second leadframe lead;
    a fourth electrical interconnect coupled between the first current carrying terminal of the second semiconductor device and the control terminal of the first semiconductor device;

a fifth electrical interconnect coupled between the second current carrying terminal of the first semiconductor device and the second mounting structure.

10. The semiconductor component of claim 1, wherein the leadframe further includes a third leadframe lead integrally formed with the die receiving area.

11. A semiconductor component, comprising:
a leadframe having a device receiving area;
a first substrate and a second substrate, the first substrate mounted to a first portion of the device receiving area and the second substrate mounted to a second portion of the device receiving area;
a III-N semiconductor device mounted to a first portion of the first substrate, the III-N semiconductor device having a control electrode and first and second current carrying electrodes;
a semiconductor device mounted to a first portion of the second substrate, the semiconductor device having first and second current carrying electrodes;
a first electrically conductive lead spaced apart from the first substrate and the second substrate; and
at least one electrical interconnect coupling the control electrode of the III-N semiconductor device to the second current carrying electrode of the semiconductor device.

12. The semiconductor component of claim 11, further including:
a second electrically conductive lead electrically coupled to the device receiving area;
at least one electrical interconnect coupling the first current carrying electrode of the semiconductor device to the first electrically conductive lead;
at least one electrical interconnect coupling the second current carrying electrode of the semiconductor device to the second current carrying electrode of the III-N semiconductor device; and
at least one electrical interconnect coupling the first current carrying electrode of the III-N semiconductor device to the second electrically conductive lead.

13. The semiconductor component of claim 12, wherein the first electrically conductive lead and the die receiving area are in different planes and the first electrically conductive lead and the second electrically conductive lead are in the same plane.

14. The semiconductor component of claim 11, wherein the semiconductor device mounted to the first portion of the second substrate comprises a silicon based semiconductor device.

15. The semiconductor component of claim 11, wherein the first substrate is a first direct bonded copper substrate and the second substrate is a second direct bonded copper substrate.

16. The semiconductor component of claim 15, wherein the first direct bonded copper substrate includes a first layer of dielectric material between first and second layers of copper and the second direct bonded copper substrate includes a second layer of dielectric material between third and fourth layers of copper.

17. The semiconductor component of claim 15, wherein the first electrically conductive lead is electrically isolated from the first substrate and the second substrate.

* * * * *